United States Patent [19]
Ikeda

[11] Patent Number: 5,606,528
[45] Date of Patent: Feb. 25, 1997

[54] SEMICONDUCTOR MEMORY DEVICE ALLOWING DATA REWRITING ELECTRICALLY

[75] Inventor: Yutaka Ikeda, Hyogo, Japan

[73] Assignee: Mitsubishi Denki Kabushiki Kaisha, Tokyo, Japan

[21] Appl. No.: 553,910

[22] Filed: Nov. 6, 1995

[30] Foreign Application Priority Data

Jan. 10, 1995 [JP] Japan ................................. 7-001931

[51] Int. Cl.$^6$ ......................................................... G11C 8/00
[52] U.S. Cl. .............................. 365/230.01; 365/230.03; 365/230.04
[58] Field of Search .................... 365/230.01, 230.03, 365/230.04

[56] References Cited

U.S. PATENT DOCUMENTS

| | | | |
|---|---|---|---|
| 5,485,426 | 1/1996 | Lee et al. | 365/230.03 |
| 5,497,349 | 3/1996 | Nakai et al. | 365/230.03 |
| 5,499,215 | 3/1996 | Hatta | 365/230.03 |

*Primary Examiner*—Son T. Dinh
*Attorney, Agent, or Firm*—Lowe, Price, LeBlanc & Becker

[57] ABSTRACT

A memory array block MK of the same structure is arranged in all the memory array regions MA of a DRAM. An IO line control circuit connects the other end of a pair of local signal input/output lines to one end of a pair of global signal input/output lines in an opposite phase or a positive phase in response to one end of the corresponding pair of local signal input/output lines being connected to an even numbered bit line pair of the upper row of memory array region MA or an odd numbered bit line pair of the lower row of memory array region MA. Since the memory array blocks MK in all the memory array region MA have the same structure, a memory cell corresponding to a defective address detected in a BI test can easily be identified.

3 Claims, 24 Drawing Sheets

74.0

74.0

SEMICONDUCTOR MEMORY DEVICE ALLOWING DATA REWRITING ELECTRICALLY

BACKGROUND OF THE INVENTION

1. Field of the Invention

The present invention relates to semiconductor memory devices, and more particularly, to a semiconductor memory device in which electrical rewriting of data is possible.

2. Description of the Background Art

FIG. 8 is a circuit block diagram showing a structure of a conventional 4M-bit dynamic random access memory (referred to as DRAM hereinafter). Referring to FIG. 8, the DRAM includes control signal input terminals 50–53, a data signal input/output terminal group 54, and an address signal input terminal group 55. The DRAM further includes a clock generation circuit 56, a data input buffer 57, a data output buffer 58, an address buffer 59, a column decoder 60, a predecoder 61, a row decoder 62, and a 1M-bit memory mat 63. Four sets of column decoder 60, row decoder 62 and memory mat 63 are provided corresponding to four data signal input/output terminals DQ1–DQ4.

Clock generation circuit 56 selects a predetermined operation mode according to externally applied signals /CAS and /RAS via control signal input terminals 50 and 51, and controls the entire DRAM. Data input buffer 57 responds to an externally applied signal /WE via control signal input terminal 52 to provide data from data signal input/output terminal group 54 to memory mat 63 via a pair of global signal input/output lines GIO, /GIO.

Data output buffer 58 responds to an externally applied signal/OE via control signal input terminal 53 to provide data readout from memory mat 63 to data signal input/output terminal group 54.

Address buffer 59 responds to externally applied address signals A0–A9 via address signal input terminal group 55 to provide column address signals CA0–CA9, /CA0-/CA9 to column decoder 60, column address signals /CA0, CA0 to memory mat 63, and row address signals RA0–RA9, /RA0-/RA9 to predecoder 61.

Column decoder 60 responds to column address signals CA1–CA9, /CA1-/CA9 from address buffer 59 to select one of 512 column select lines CSL0–CSL511 of memory mat 63.

Predecoder 61 responds to row address signals RA0–RA9,/RA0-/RA9 from address buffer 59 and activation signal XADE from clock generation circuit 56 to provide predecode signals AXA0–AXA3, AXB0–AXB3, AXC0–AXC7, AXD0–AXD7 to row decoder 62, and predecode signals AXD0–AXD7 to memory mat 63.

As shown in FIGS. 9–12, predecoder 61 includes 24 AND gates 61a–61x. Each of AND gates 61a–61x includes a NAND gate and an inverter connected in series. When two of row address signals RA0, RA1,/RA0,/RA1 and activation signal XADE attain an H level (logical high), one of predecode signals AXA0–AXA3 are driven to an H level of activation. When two of row address signals RA2, RA3,/RA2,/RA3 attain an H level, one of predecode signals AXB0–AXB3 attain an H level of activation. When three of row address signals RA4, RA5, RA6,/RA4,/RA5,/RA6 attain an H level, one of predecode signals AXC0–AXC7 attain an H level of activation. When three of row address signals RA7, RA8, RA9,/RA7,/RA8,/RA9 attain an H level, one of predecode signals AXD0–AXD7 attains an H level of activation.

Row decoder 62 responds to predecode signals AXA0–AXA3, AXB0–AXB3, AXC0–AXC7, AXD0–AXD7 from predecoder 61 to select one of 1024 word lines WL0–WL1023 of memory mat 63.

Memory mat 63 responds to column address signals CA0, /CA0 from address buffer 59, predecode signals AXD0–AXD7 from predecoder 61, and signals SO, /IOEQ from clock generation circuit 5,5 to connect a memory cell selected by column and row decoders 60 and 62 to the pair of global signal input/output lines GIO, /GIO.

FIG. 13 shows a chip layout of the DRAM of FIG. 8. Referring to FIG. 13, four memory mats 63 are provided at the four corners of a rectangular chip. Four row decoders 62 are provided along the long sides of the four memory mats 63. Four column decoders 60 are provided along the short sides of the four memory mats 63. Clock generation circuit 56 shown in FIG. 8 is provided in a peripheral circuit region 64 at the center portion of the chip.

FIG. 14 is a circuit block diagram showing a structure of memory mat 63 shown in FIGS. 8 and 13. Referring to FIG. 14, memory mat 63 includes nine sense amplifier regions SA0–SA8, eight memory array regions MA0–MA7 provided therebetween, and a pair of global signal input/output lines GIO,/GIO arranged so as to traverse sense amplifier regions SA0–SA8 and memory array region MA0–MA7.

Eight memory array blocks MK are provided in respective memory array regions MA0, MA2, MA4, and MA6. Eight memory array blocks/MK are provided in respective memory array regions MA1, MA3, MA5 and MA7.

FIG. 15 is a circuit block diagram of memory array block MK of FIG. 14 with a portion thereof omitted. Referring to FIG. 15, memory array block MK of an alternate variable type cell arrangement includes 128 word lines WL09–WL127, 256 bit lines BL0,/BL0-/BL63, BL63; BL0', /BL0'-/BL63', BL63', and a memory cell pair MCP arranged in a predetermined interval at the crossing of two word lines WL and one bit line BL.

As shown in FIG. 16, memory cell pair MCP includes a memory cell MC connected to one of the two word lines WL and bit line BL, and a memory cell MC connected to the other word line WL and bit line BL. Memory cell MC includes a transistor Q for access, and a capacitor C for storing information.

The (8n+1)th (n is an integer from 0–31) and (8n+3)th bit lines, the (8n+2)th and (8n+4)th bit lines, the (8n+7)th and (8n+5)th bit lines, and the (8n+8)th and (8n+6)th bit lines respectively form a bit line pair.

Memory cell pair MCP is arranged at the crossing of the first bit line BL0 and the (4m+1)th (m is an integer from 0–31) and (4m+2)th word lines WL0, WL1; ... Memory cell pair MCP is arranged at the crossing of the second bit line BL0' and the (4m+2)th and (4m+3)th word lines WL1, WL2 ... Memory cell pair MCP is arranged at the crossing of the third bit line/BL0 and the (4m+3)th and (4m+4)th word lines WL2, WL3; ... A memory cell pair MCP is arranged at the crossing of the fourth bit line /BL0 and the (4M+1)th and (4m+4)th word lines WL0, and WL3, . . . At the same interval, a memory cell pair MCP is arranged at the crossing of one bit line BL and two word lines WL.

Bit lines BL, BL of the odd number order are connected to an array select gate SAG provided at the upper end of memory array block MK. Bit lines BL', /BL' of the even number order are connected to an array select gate SAG' provided at the lower end of memory array block MK. Array select gates SAG and SAG' are controlled by array select signals SA1 and SA1', respectively. At normal times (in a stand-by state), array select gates SAG and SAG' are closed. When memory array block MK is selected, array select gate SAG or SAG' of memory array block/MK adjacent to memory array block MK in the extending direction of the bit line is opened.

It is to be noted that dummy word lines DWL0, DWL1 and dummy bit lines DBL0, DBL1 are provided for the purpose of improving the yield at the time of manufacturing, and are not used in writing or reading data.

As shown in FIG. 17, memory array block/MK forms a mirror-inversion of memory array block MK of FIG. 15.

Each of sense amplifier regions SA0–SA8 includes eight sense amplifier blocks SK, a pair of local signal input/output lines LIO, /LIO commonly shared by eight sense amplifier blocks SK, a sense amplifier block control circuit 71, an IO line control circuit 72 or 72', and a memory array control circuit 73.

Sense amplifier block SK of sense amplifier region SA0 is connected to the odd numbered pair of bit lines BLP of memory array block MK in memory array region MA0. Sense amplifier block SK of sense amplifier region SA1 is connected to the bit line pair BLP' of the even order number of memory array blocks MK of memory array region MA0 and memory array block/MK of memory array region MA1. Sense amplifier block SK of sense amplifier region SA2 is connected to bit line pair BLP of the odd number order of memory array blocks /MK of memory array region MA1 and memory array block MK of memory array region MA2. All sense amplifier blocks SK are connected in a similar manner.

As shown in FIG. 18, sense amplifier block SK corresponding to column select lines CSL0–CSL63 of sense amplifier region SA1 includes 64 bit line control circuits 74.0–74.63, and an IO line precharge circuit 75. Each of bit line control circuits 74.0–74.63 are commonly shared by even numbered bit line pairs BL0', /BL0'; /BL1', BL1'; ... ; BL63', BL63' of memory array block MK of memory array region MA0 and memory array block /MK of memory array region MA1, respectively. Bit line control circuits 74.0–74.63 are connected to column select lines CSL0–CSL63, respectively. All sense amplifier blocks SK corresponding to the other column select lines CSL64–CSL127; ... ; CSL448–CSL511 are connected in a similar manner.

As shown in FIG. 19, bit line control circuit 74.0 includes an N channel sense amplifier 80, a P channel sense amplifier 81, a bit line equalize circuit 82, and a column select gate 83.

N channel sense amplifier 80 includes an N channel MOS transistor 86 connected between nodes 84 and S2N, an N channel MOS transistor 87 connected between nodes 85 and S2N, and an N channel MOS transistor 88 connected between node S2N and ground potential line 102. N channel MOS transistors 86 and 87 have their gates connected to nodes 85 and 84, respectively. The gate of N channel MOS transistor 88 receives an activation signal SON.

P channel sense, amplifier 81 includes a P channel MOS transistor 89 connected between nodes 84 and S2P, a P channel MOS transistor 90 connected between nodes 85 and S2P, and a P channel MOS transistor 91 connected between node S2P and a power supply potential line 100. P channel MOS transistors 89 and 90 have their gates connected to nodes 85 and 84, respectively. The gate of P channel MOS transistor 91 receives an activation signal/SOP.

Bit line equalize circuit 82 includes an N channel MOS transistor 92 connected between node 84 and a precharge potential line 101, an N channel MOS transistor 93 connected between node 85 and precharge potential line 101, and an N channel. MOS transistor 94 connected between nodes 84 and 85. The gates of N channel MOS transistors 92–94 receive a bit line equalize signal BLEQ. A precharge potential VBL (=Vcc/2) is applied to precharge potential line 101.

Column select gate 83 includes N channel MOS transistors 95 and 96. N channel MOS transistor 95 is connected between node 84 and a local signal input/output line LIO1. N channl MOS transistor 96 is connected between node 85 and a local signal input/output line /LIO1. The gates of N channel MOS transistors 95 and 96 are connected to a column select line CSL0.

Node 84 is connected to bit line BL0' of memory array regions MA0 and MA1. Node 85 is connected to bit line /BL0' of memory array regions MA0 and MA1. The other odd numbered bit line control circuits 74.0, 74.2, . . . , 74.62 are connected in a similar manner.

FIG. 20 is a circuit diagram showing a structure of bit line control circuit 74.1. The circuit configuration of bit line control circuit 74.1 is similar to that of bit line control circuit 74.0 of FIG. 19 provided that the connection of column select gate 83 and nodes 84 and 85 differ. More specifically, N channel MOS transistor 95 of column select gate 82 is connected between node 84 and local signal input/output lines/LIO1. N channel MOS transistor 96 is connected between node 85 and local signal input/output line LIO1. N channel MOS transistors 95 and 96 have their gates connected to column select line CSL1. Node 84 is connected to bit line /BL1 of memory array regions MA0 and MA1. Node 85 is connected to bit line BL1' of memory array region MA0 and MA1. The other even numbered bit line control circuits 74.1, 74.3, . . . , 74.63 are connected in a similar manner.

IO line precharge circuit 75 includes N channel MOS transistors 76 and 77 connected in series between node S2N and of N channel sense amplifier 80 of each of bit line control circuits 74.0–74.63 and local signal input/output line LIO1, and a P channel MOS transistor 78 and an N channel MOS transistor 79 connected in series between node S2P of P channel sense amplifier 81 of each of bit line control circuits 74.0–74.63 and local signal input/output line /LIO1. The gates of N channel MOS transistors 76, 77 and 79 receive bit line equalize signal BLEQ. The gate of P channel MOS transistor 78 receives a signal /BLEQ which is an inverted version of the bit line equalize signal. The node of MOS transistors 76 and 77 and the node of MOS transistors 78 and 79 are both connected to precharge potential line 101.

FIG. 21 is a circuit diagram showing a structure of sense amplifier block control circuit 71 in sense amplifier region SA1. Referring to FIG. 21, sense amplifier block control circuit 71 includes an NOR gate 100, NAND gates 101 and 102, and inverters 103–111. NOR gate 100 receives electrode signals AXD0 and AXD1. One input node of each of NAND gates 101 and 102 receives sense amplifier activation signal SO.

The output of OR gate 100 is delayed by inverter 103, NAND gate 101, and inverters 104–106 to result in a signal SON. Signal SON is further delayed by NAND gate 102 and inverters 107 and 108 to result in signal /SOP. The output of NOR gate 100 is also delayed by inverters 109 and 110 to result in signal BLEQ. The output of NOR gate 100 is delayed by inverter 111 to result in a signal /BLEQ. Signals SON, /SOB, BLEQ, /BLEQ are provided to each sense amplifier block SK of sense amplifier region SA1 when one either decode signal AXD0 or AXD1 and sense amplifier activation signal S0 both attain an H level of activation.

Predecode signals AXD0 and AXD1 indicate that memory array regions MA0 and MA1 are selected, respectively. Since sense amplifier region SA1 is shared by memory array regions MA0 and MA1, sense amplifier block SK is activated when one of memory array regions MA0 and MA1 is selected and sense amplifier activation signal $0 attains an H level of activation.

Sense amplifier block control circuit 71 of the other sense amplifier regions SA0, SA2–SA8 are provided in a similar manner. The only difference is that sense amplifier block control circuit 71 of sense amplifier block SA0 provides signals SON, /SOP, BLEQ and /BLEQ in response to signals AXD0 and $0 driven to an H level of activation. Furthermore, sense amplifier block control circuit 71 of sense amplifier region SA8 provides signals SON, /SOP, BLEQ, /BLEQ in response to signals AXD7 and SO attaining an H level of activation.

FIG. 22 is a circuit diagram showing a structure of IO line control circuit 72' of sense amplifier region SA1. Referring to FIG. 22, IO line control circuit 72' includes NOR gates 112 and 113, N channel MOS transistors 114 and 115, transfer gates 116 and 118, and inverters 117 and 118. N channel MOS transistor 114 is connected between one end of local signal input/output line/LIO1 and one end of global signal input/output line GIO. N channel MOS transistor 115 is connected between one end of local signal input/output line LIO1 and one end of global signal input/output line/ GIO. More specifically, the pair of local signal input/output lines LIO1, /LIO1 and the pair of global signal input/output lines GIO, /GIO are connected in an opposite phase via N channel MOS transistors 114 and 115. The reason of such a connection will be described in detail afterwards.

NOR gate 112 receives predecode signals AXD0 and AXD1. NOR gate 113 receives an output of NOR gate 112 and column address signal CA0. The output of NOR gate 113 is provided to the gates of N channel MOS transistors 114 and 115.

Transfer gate 116 is connected between the pair of local signal input/output lines LIO1 and /LIO1. Signal /IOEQ is applied to a gate 116a of the P channel MOS transistor side of transfer gate 116, and also to a gate 116b of the N channel MOS transistor side of transfer gate 116 via inverter 117.

Transfer gate 118 is connected between the pair of global signal input/output lines GIO and /GIO. Signal /IOEQ is applied to a gate 118a of the P channel MOS transistor side of transfer gate 118, and also to a gate 118b of the N channel MOS transistor side of transfer gate 118 via inverter 119.

Predecode signals AXD0 and AXD1 are signals for selecting memory array regions MA0 and MA1, respectively. Column address signal. GA0 selects an odd numbered bit line pair BLP. The reason why N channel MOS transistors 114 and 115 are rendered conductive when one of predecode signals AXD0 and AXD1 attains an H level of activation and column address signal CA0 attains an L level of inactivation is due to the pair of local signal input/output lines LIO1 and/LIO1 shared by the even numbered bit line pair BLP' of memory array region MA0 and the even numbered bit line pair BLP' of memory array region MA1.

The same applies for sense amplifier block control circuit 72' of sense amplifier regions SA3, SA5 and SA7.

FIG. 23 is a circuit diagram showing a structure of IO line control circuit 72 of sense amplifier region SA2. Referring to FIG. 23, IO line control circuit 72 differs from IO line control circuit 72' of FIG. 22 in that N channel MOS transistor 114 is connected between one end of local signal input/output line LIO2 and one end of global signal input/ output line GIO, N channel MOS transistor 115 is connected between one end of local signal input/output /LIO2 and one end of global signal input/output line /GIO, and that the pair of local signal input/output lines LIO2, /LIO2 and the pair of global signal input/output lines GIO, /GI02 are connected in a positive phase. Furthermore, NOR gate 112 receives predecode signals AXD1 and AXD2. NOR gate 113 receives an output of NOR gate 112 and column address signal /CA0.

Predecode signal is AXD1 and AXD2 serve to select memory array regions. MA1 and MA2, respectively. Column address signal/CA0 serves to select an odd numbered bit line pair BLP. N channel MOS transistors 114 and 115 are rendered conductive when one of predecoder signals AXD1 and AXD2 attains an H level of activation and column address signal /CA0 attains an L level of inactivation. This is because the pair of local signal input/output lines LIO1 and/LIO2 are shared by odd numbered bit line pair BLP of memory array region MA1 and odd numbered bit line pair BLP of memory array region MA2.

The same applies for IO line control circuit 72 of sense amplifier regions SA0, SA4, SA6 and SA8. However, it is to be noted that IO line control circuit 72 of sense amplifier region SA0 is activated by signals AXD0 and /CA0, and IO line control circuit 72 of sense amplifier region SA8 is activated by signals AXD7 and /CA0.

FIG. 24 is a circuit diagram showing a structure of memory array block control circuit 73 of sense amplifier region SA1. Referring to FIG. 24, memory array block control circuit 73 includes inverters 120–125. Predecode signal AXD0 is delayed and inverted by inverters 120–122 to result in an array select signal S1'. Predecode signal AXD2 is delayed and inverted by inverters 123–125 to result in an array select signal S1. Array select signals S1' and S1 are provided to array select gates SA1' and SA1 of memory array block/MK of memory array region MA1.

More specifically, when predecode signal AXD1 attains an H level of activation to select memory array block/MK of memory array region MA1, array select gate SAG' of memory array block of memory array region MA0 and array select gate SAG of memory array block MK of memory array region MA2 are cut off. Then, memory array block MK of memory array regions MA0 and MA2 and sense amplifier block SK of sense amplifier regions SA1 and SA2 are cut off.

When predecode signal AXD2 attains an H level of activation to select memory array block MK of memory array region MA2, array select gate SAG of memory array block /MK of memory array region MA1 and array select gate SAG' of memory array block/MK of memory array region MA3 are cut off. Then, memory array block /MK of memory array regions MA1 and MA3 and sense amplifier block SA of sense amplifier regions SA2 and SA3 are cut off.

The same applies for memory array block control circuit 73 of other sense amplifier regions SA0 and SA2–SA7, provided that memory array block control circuit 73 of sense amplifier SA0 cuts off array select gate SAG' of memory array block MK of memory array region MA0 only when memory array block /MK of memory array region MA1 is selected. Also, memory array block control circuit 73 of sense amplifier region SA7 cuts off array select gate SAG' of memory array block /MK of memory array region MA7 only when memory array block MK of memory array region MA6 is selected. Array selected gate SAG of memory array block MK of memory array region MA0 and memory array block /MK of memory array region MA7 are always conductive.

FIG. 25 is a timing chart for describing the operation of the DRA34 of FIGS. 8–24. A readout operation of this DRAM will be described hereinafter with reference to FIGS. 8–25.

When signal/RAS applied to control signal input terminal 51 attains an L level of activation, clock generation circuit 56 renders address buffer 56 active. Address buffer 59 receives address signals A0–A9 from address signal input terminal group 55 to provide row address signals RA0–RA9, /RA0-/RA9 to predecoder 61.

Then, predecoder 61 responds to activation signal XADE from clock generation circuit 56 to provide predecode signals AXA0–AXA3, AB0–AXB3, AXC0–AXC7, and AXD0–AXD7 to row decoder 62, and decode signals AXD0–AXD7 to memory mat 63.

Here, predecode signals AXA0–AXA3, AXB0–AXB3, AXC0–AXC7, and AXD0–AXD7 serve to specify word line WL128 in memory array region MA1 of memory mat 63. When predecode signal AXD1 attains an H level of activation, bit line equalize signals BLEQ, /BLEQ which are outputs of sense amplifier block control circuit 71 of sense amplifier regions SA1 and SA2 are driven to an L level and an H level, respectively. As a result, transistors 92–94 of bit line equalize circuit 82 in sense amplifier block SK of sense amplifier regions SA1 and SA2 and transistors 76–79 of IO line precharge circuit 75 are cut off, whereby data can be read out to the bit line.

In response to predecode signal AXD1 attaining an H level of activation, array select signal S1' which is an output of memory array block control circuit 73 of sense amplifier region SA0 is pulled down to an L level, whereby memory array block MK of memory array region MA0 and sense amplifier block SK of sense amplifier region SA1 are cut off, and array select signal S1 which is an output of memory array block control circuit 73 of sense amplifier region SA2 attains an L level, whereby memory block MK of memory array region MA2 and sense amplifier block SK of sense amplifier region SA2 are cut off.

Also, row decoder 62 responds to predecode signals AXA0–AXA3, AXB0–AXB3, AXC0–AXC7, and AXD0–AXD7 to pull up the corresponding word line WL128 to the selected state of an H level. The rise of word line WL128 to an H level causes transistor Q of all memory cells MC connected to word line WL128 to conduct, whereby the potential of bit lines BL, /BL, and BL', /BL' vary slightly according to the potential stored in capacitor C.

Then, when sense amplifier activation signal SO from clock generation circuit 56 attains an H level of activation, signals SON, /SOP which are outputs of sense amplifier block control circuit 71 of sense amplifier regions SA1 and SA2 attain an H level and an L level, respectively.

N channel sense amplifier 80 and P channel sense amplifier 81 are activated in response to signals SON and /SOP attaining an H level and an L level, respectively, whereby the potential of all the bit lines in memory array blocks /MK of memory array region MA1 is amplified to attain an H level of an L level according to information stored in memory cell MC.

Then, address buffer 59 receives address signals A0–A9 from address signal input terminal group 55, whereby column address signals CA0–CA9, /CA0-/CA9 are applied to column decoder 60, end column address signals CA0, /CA0 are applied to memory mat 63.

Assuming that column address signals CA0–CA9, CA0-/CA9 specify the second pair of bit lines BL0', /BL0' of memory array region MA1, and column address signal CA0 attains an L level, N channel MOS transistors 114 and 115 of IO line control circuit 72' of sense amplifier region SA1 are rendered conductive. Here, IO line equalize signal /IOEQ output from clock generation circuit 56 attains an H level of inactivation, whereby transfer gates 116 and 118 are cut off.

Then, at the same time, column decoder 60 responds to column address signals CA1–CA9, /CA1-/CA9 to pull up corresponding column select line CSL0 to the selected state of an H level. Although column select signal CSL0 attaining an H level causes the first bit line pair BL0, /BL0 and the second bit line pair BL0', /BL0' of memory array regions MA0–MA7 to be connected to respective corresponding pairs of column signal input/output lines LIO, /LIO, only the second pair of bit lines BL0', /BL0'of memory array region MA1 is connected.

Data output buffer 58 maintains data of the pair of global signal input/output lines GIO, /GIO, and responds to output enable signal /OE applied to control signal input terminal 53 attaining an L level of activation, whereby the held data is provided to a corresponding input/output terminal (for example DQ1).

BI (Burn In) testing carried out on each chip prior to shipment of such an DRAM chip will be described hereinafter.

In BI testing, each chip is driven under a condition more severe than in a normal state. More specifically, each chip is driven at a write voltage Vt (>Vcc) higher than the normal case under a high temperature environment. Chips exhibiting failure are removed. Thus, chips that do not fail normal testing of general conditions prior to shipment, but fail at an early time after shipment, will be removed. The chips exhibiting failure are evaluated in detail to use data thereof in improving the chip yield.

Most of the testing devices carrying out automatically such a BI test are designed so that only the same data are written into all the addresses of the DRAM chip in order to reduce the cost. When using such a testing device, problems set forth in the following are encountered unless the pair of local signal input/output lines LIO1, /LIO1; . . . ; LI07, /LI07 are connected to the pair of global signal input/output lines GIO, /GIO in an opposite phase.

FIG. 26 schematically shows memory mat 63' of a DRAM having all the pairs of local signal input/output lines LIO, /LIO connected to the pair of global signal input/output line pair GIO, /GIO in the same phase.

FIG. 26 shows a state where IO line control circuit 72 of sense amplifier region SA1 is rendered conductive to cause even numbered bit line pairs BL0', /BL0'; /BL1', BL1'; . . . of memory array block /MK of memory array region MA1 to be sequentially connected to the pair of local signal input/output lines LIO1, /LIO1 to result in the written state of data "1". Then IO line control circuit 72 of sense amplifier region SA2 is rendered conductive to cause the odd numbered bit line pairs BL0, /BL0; /BL1, BL1; . . . of memory array block /MK of memory array region MA1 to be sequentially connected to the pair of local signal input/output lines LI02, /LI02 to result in the written state of data "1". Here, the potential of global signal input/output lines GIO,/GIO is Vt and 0, respectively.

When data of memory array block /MK of memory array region MA1 is to be read out, all sense amplifiers 80 and 81 of sense amplifier regions SA1 and SA2 are activated, whereby a potential identical to that of writing appears on all the bit lines of memory array block /MK of memory array region MA1.

Here, the same potential of 0 appears at the adjacent four bit lines (for example, /BL0, /BL0', /BL1'/BL1'). Therefore, the ability of detecting shorting between bit lines is low.

Therefore, the ability of detecting shorting between bit lines is improved by connecting local signal input/output line pairs LIO1, /LIO1; LI03, /LI03; . . . to the pair of global signal input/output lines GIO,/GIO in an opposite phase, so that at least one of the two bit lines adjacent to a certain bit line attains a potential different from that of the certain bit line, as shown in FIG. 27.

However, in conventional DRAMs, memory array blocks of memory array regions MA0–MA7 are mirror-inverted alternately. Therefore, it is not easy to identify a memory cell corresponding to a defective address even when that address is determined in a BI test.

SUMMARY OF THE INVENTION

In view of the foregoing, a main object of the present invention is to provide a semiconductor memory device that can carry out testing of high error detection ability using a test device of low cost that can only write the same data into all addresses, and that can easily identify a memory cell corresponding to a defective address detected in the test.

A semiconductor memory device according to an aspect of the present invention has a pair of local signal input/output lines provided in common to an even numbered bit line pair of one of two adjacent memory array blocks and an odd numbered bit line pair of the other adjacent memory array block. In response to one end of the pair of local signal input/output lines connected to the one or the other of the two memory array blocks, the other end of that pair of local signal input/output lines is connected to one end of the pair of local signal input/output lines in an opposite or positive phase. Thus, a memory array block of the same structure can be arranged, and data inverted with respect to each other can be written into an even numbered bit line pair and an odd numbered bit line pair of each memory array block. Thus, testing of a high defective detection capability can be carried out using a test device of low cost in which only the same data can be written into all the addresses. Furthermore, a memory cell corresponding to a defective address detected by the test can easily be identified.

Preferably, each memory array block includes 8×N bit lines wherein the (8n+1)th and (8n+3)th bit lines, the (8n+2)th and (8n+4)th bit lines, the (8n+7)th and (8n+5)th bit lines, and the (8n+8)th and (8n+6)th bit lines respectively form a pair of bit lines.

Furthermore, a switching circuit includes a first logic circuit for providing a first signal in response to an even numbered bit line pair of one memory array block being selected, a first connection circuit responsive to the first signal for connecting the other end of the pair of local signal input/output lines to one end of the pair of global signal input/output lines in an opposite phase, a second logic circuit for providing a second signal in response to an odd numbered bit line pair of the other memory array block being selected, and a second connection circuit responsive to the second signal for connecting the other end of the pair of local signal input/output lines to one end of the pair of global signal input/output lines in a positive phase.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
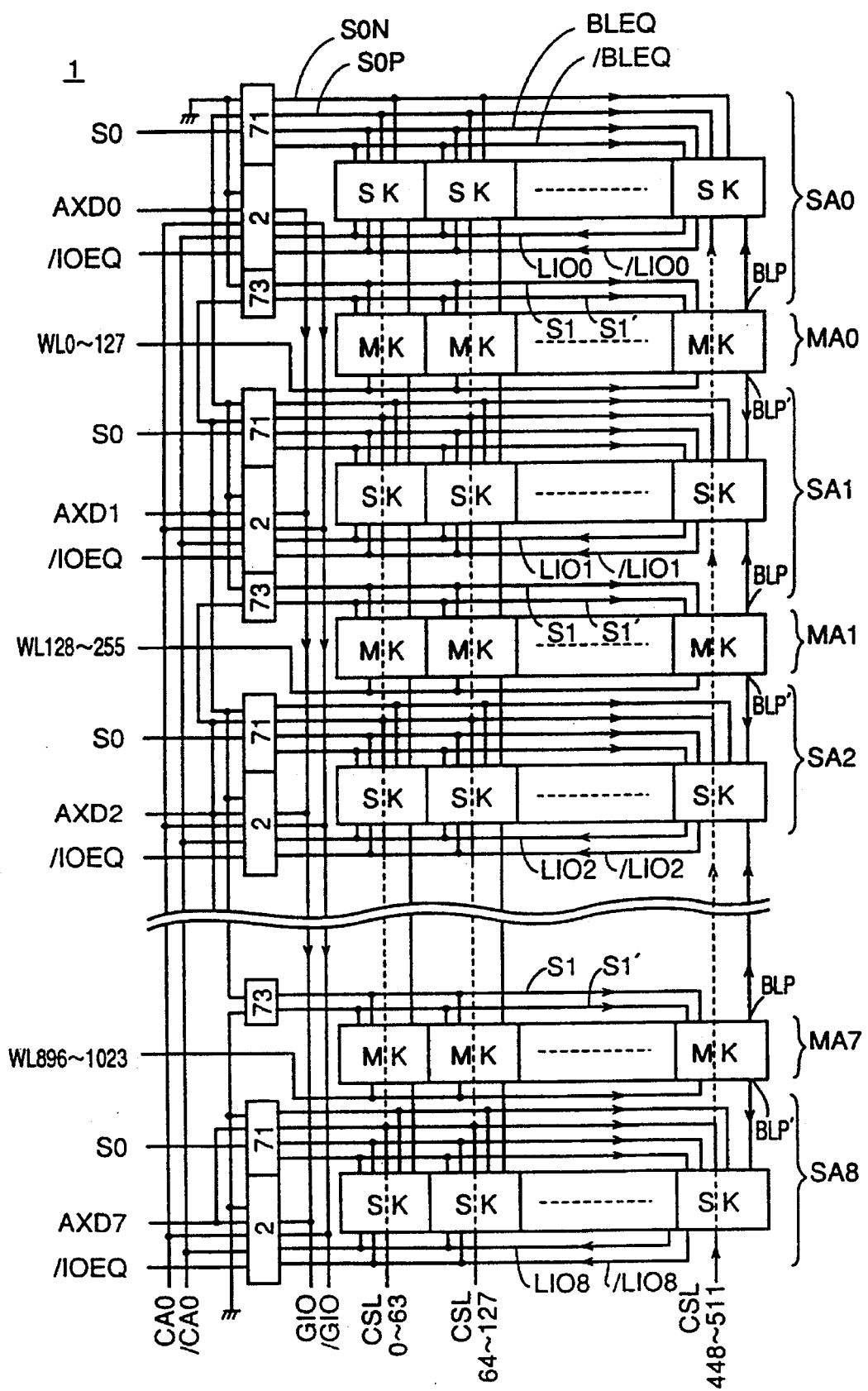
FIG. 1 is a circuit block diagram of a memory mat 1 of a DRAM according to an embodiment of the present invention with a portion thereof omitted.
Figure 14:
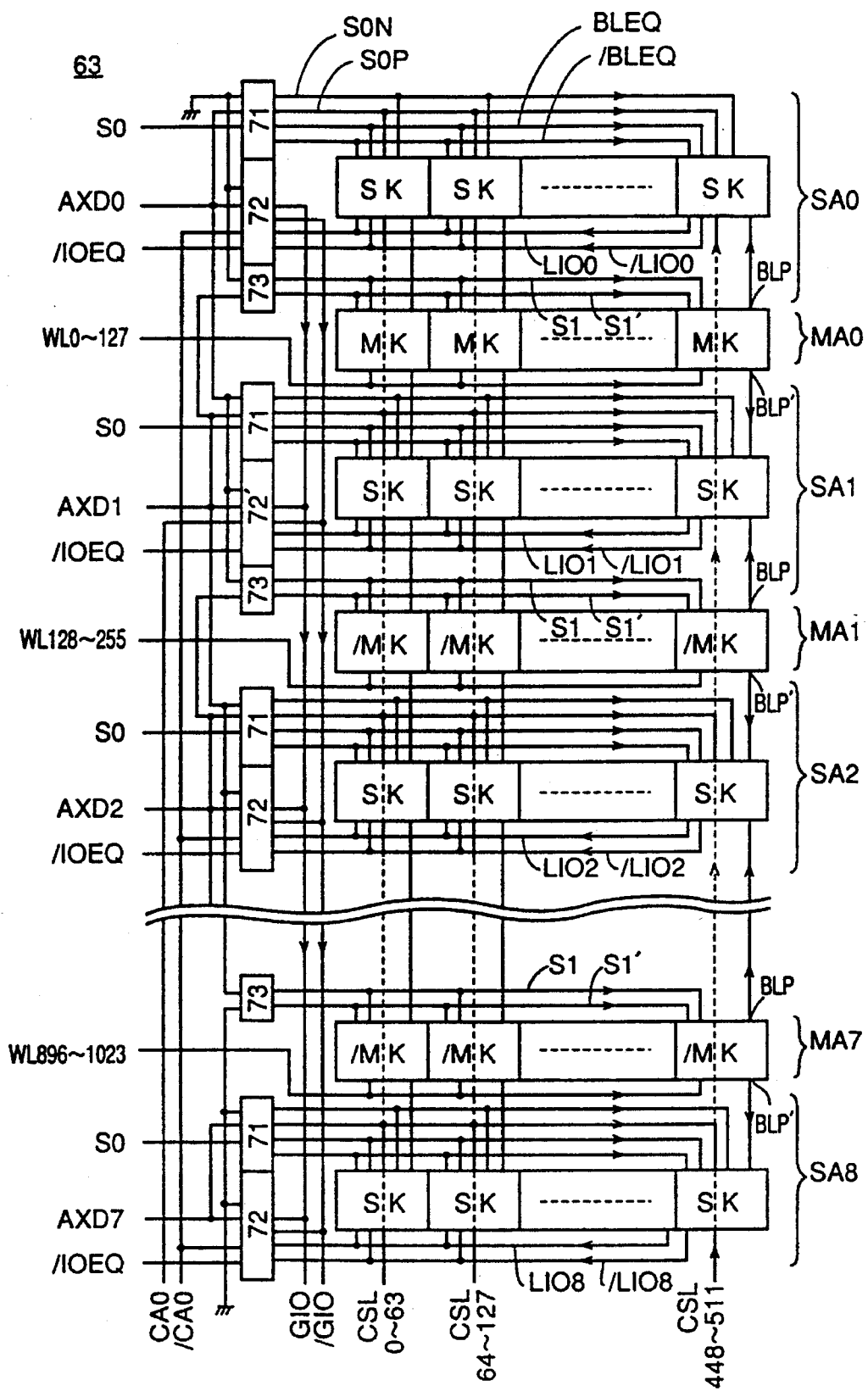
FIG. 14 is a circuit block diagram of the structure of a memory mat 63 of the DRAM of FIG. 8 with a portion thereof omitted.
Figure 15:
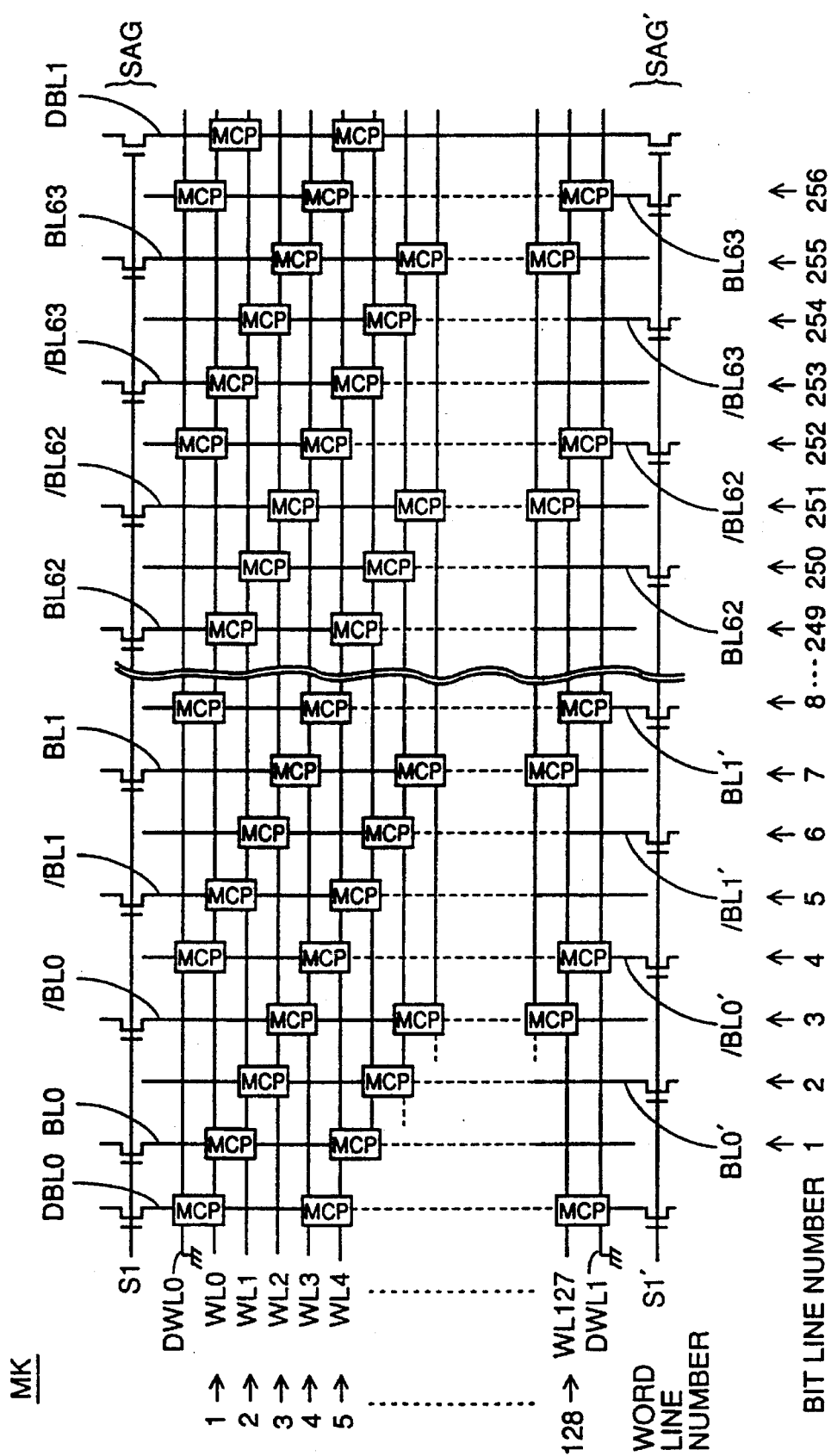
FIG. 15 is a circuit block diagram showing a structure of a memory array block MK of memory mat 63 of FIG. 14 with a portion thereof omitted.
Figure 16:
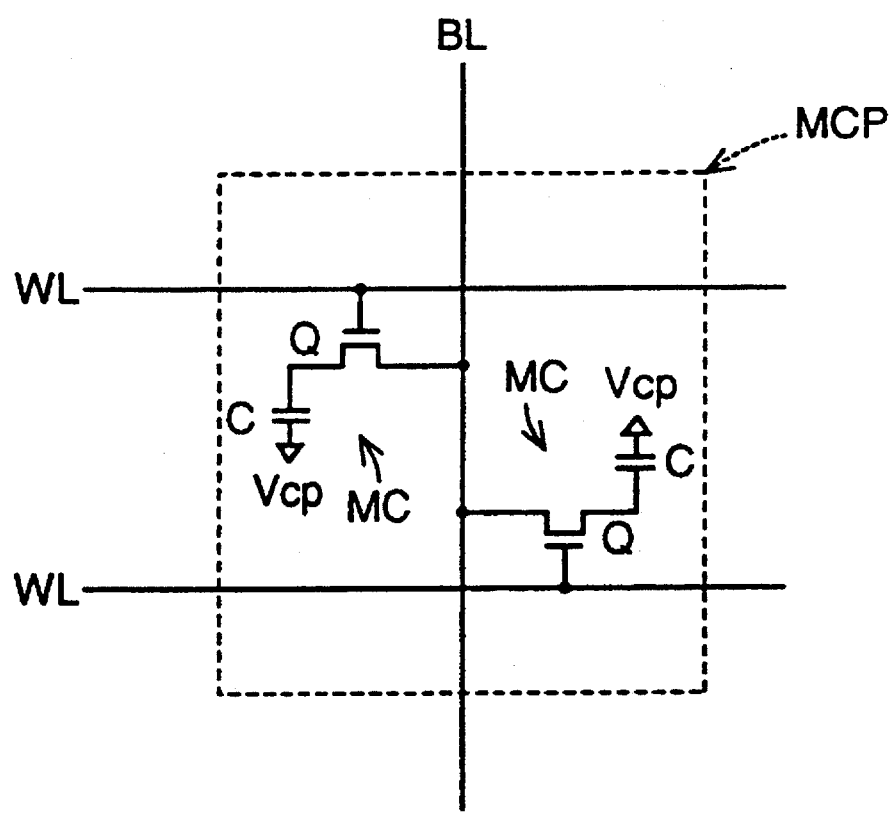
FIG. 16 is a circuit diagram showing a structure of a memory cell pair MCP of memory array block MK of FIG. 15.
Figure 17:
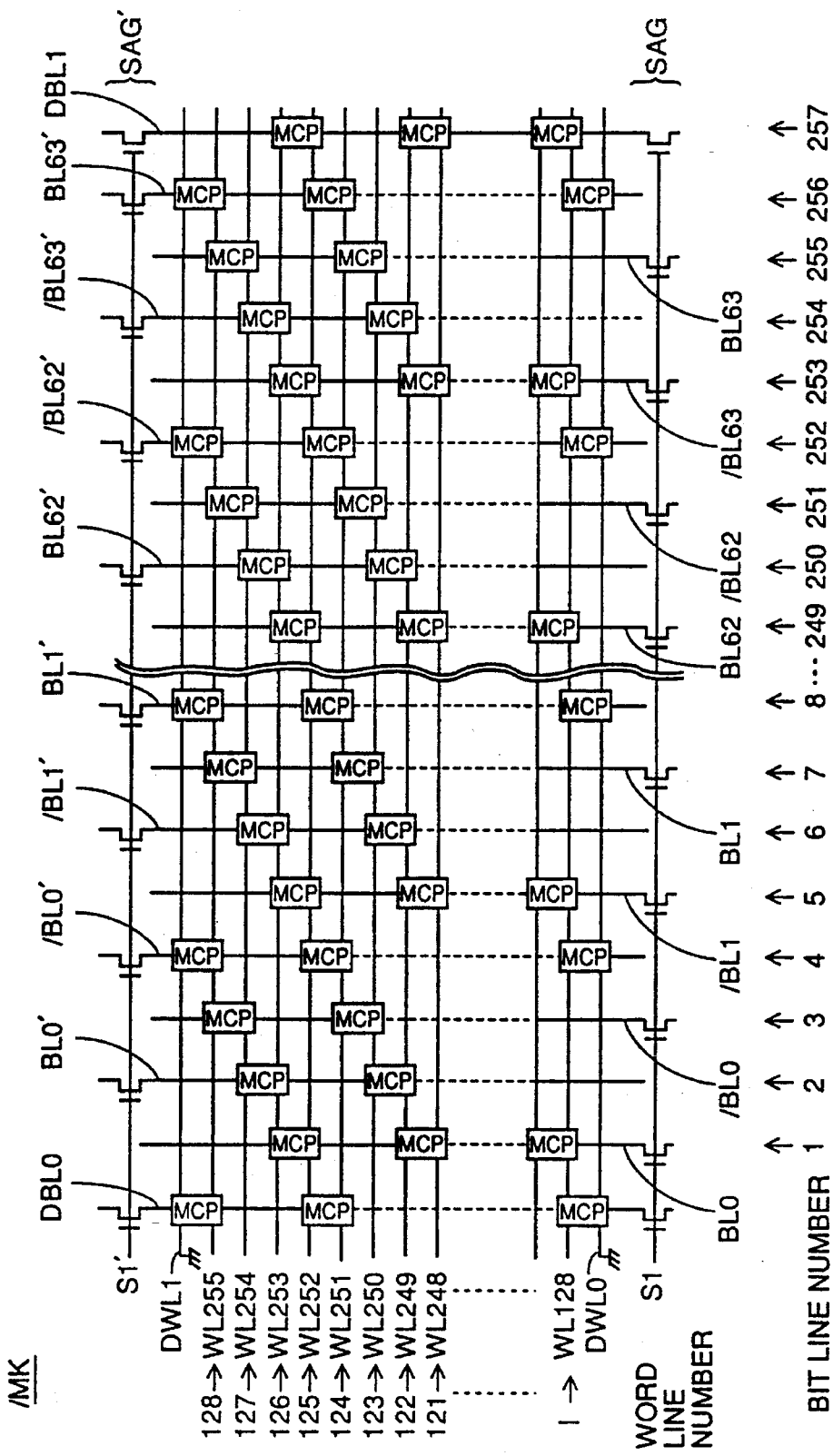
FIG. 17 is a circuit block diagram showing a structure of memory array block /MK of memory mat 63 of FIG. 14 with a portion thereof omitted.

Referring to FIG. 1, memory mat 1 of the DRAM of the present invention differs from memory mat 63 of the DRAM shown in FIG. 14 in that a memory array block MK of the same structure is arranged in all memory array regions MA0–MA7, and that an IO line control circuit 2 is provided instead of IO line control circuit 72 or 72'.

In accordance with memory array block MK of the same structure arranged in all memory array regions MA0–MA7, sense amplifier block SK of sense amplifier regions SA1–SA7 is shared by even numbered bit line pair BLP' of memory array block MK of the upper row of memory array regions MA0–MA6, and odd numbered bit line pair BLP of memory array block MK of the lower row of memory array regions MA1–MA7.

Figure 2:
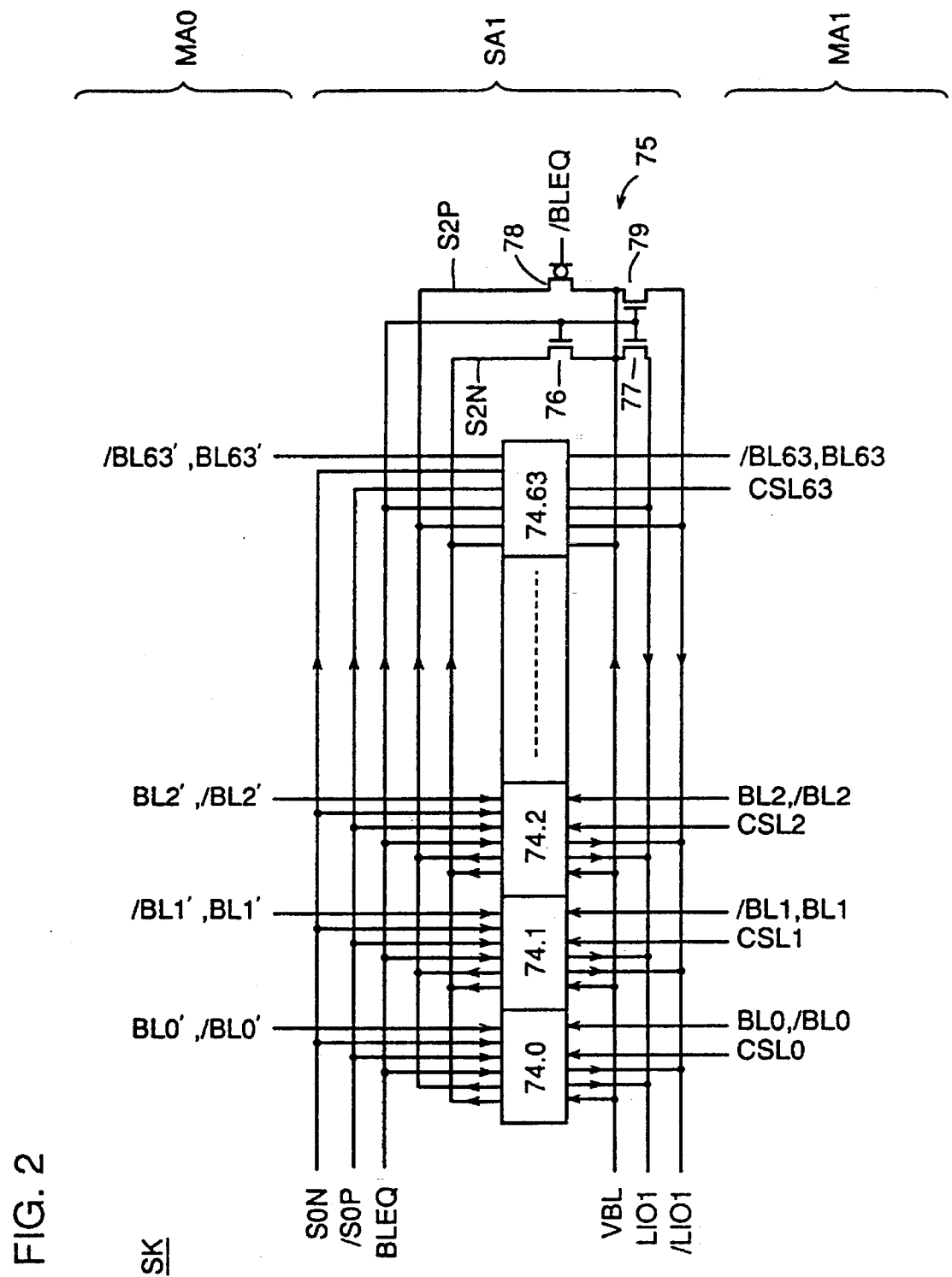
FIG. 2 is a circuit block diagram showing a structure of a sense amplifier block SK of a sense amplifier region SA1 of memory mat 1 of FIG. 1.
Figure 3:
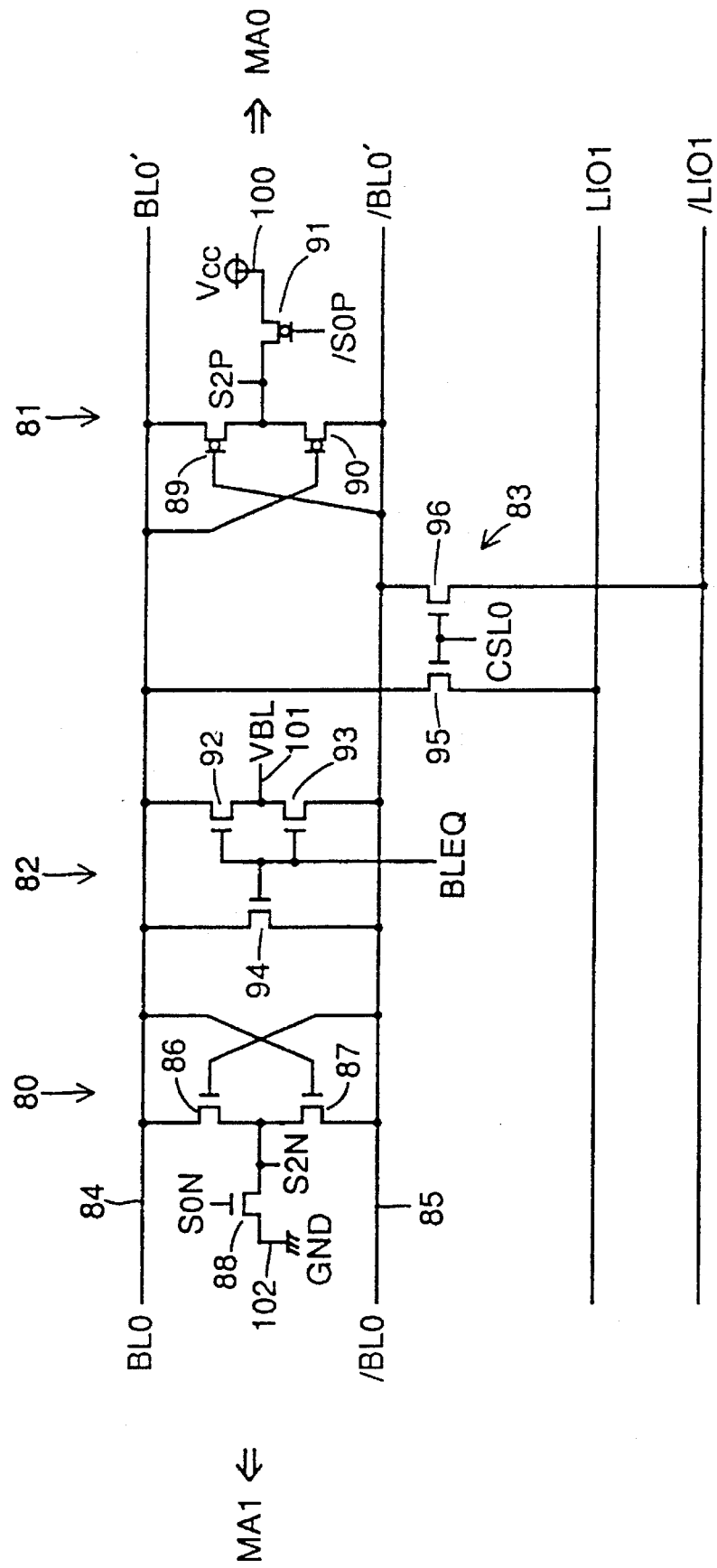
FIGS. 3 and 4 are circuit diagrams showing a bit line control circuit 740 and a bit line control circuit 741, respectively, of sense amplifier block SK of FIG. 2.
Figure 4:
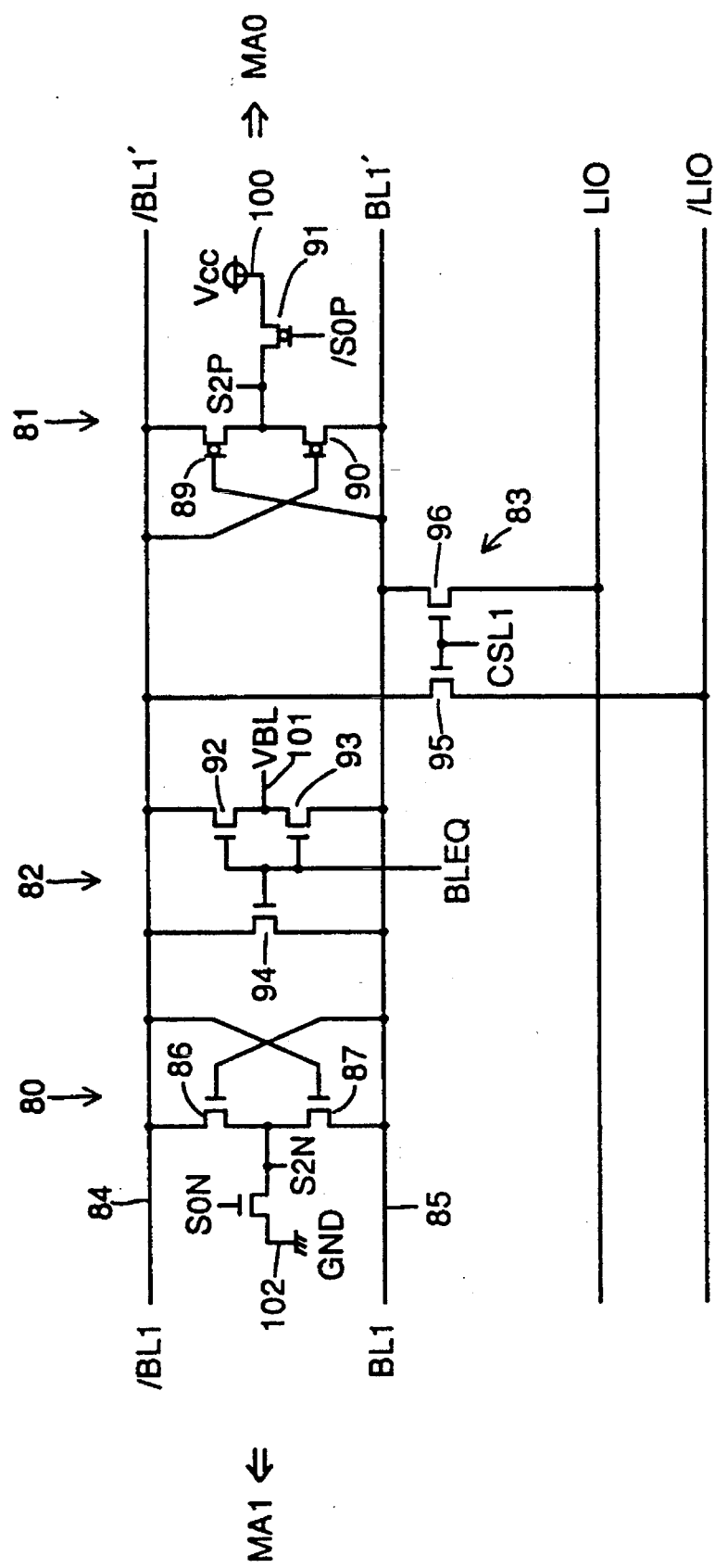
Figure 18:
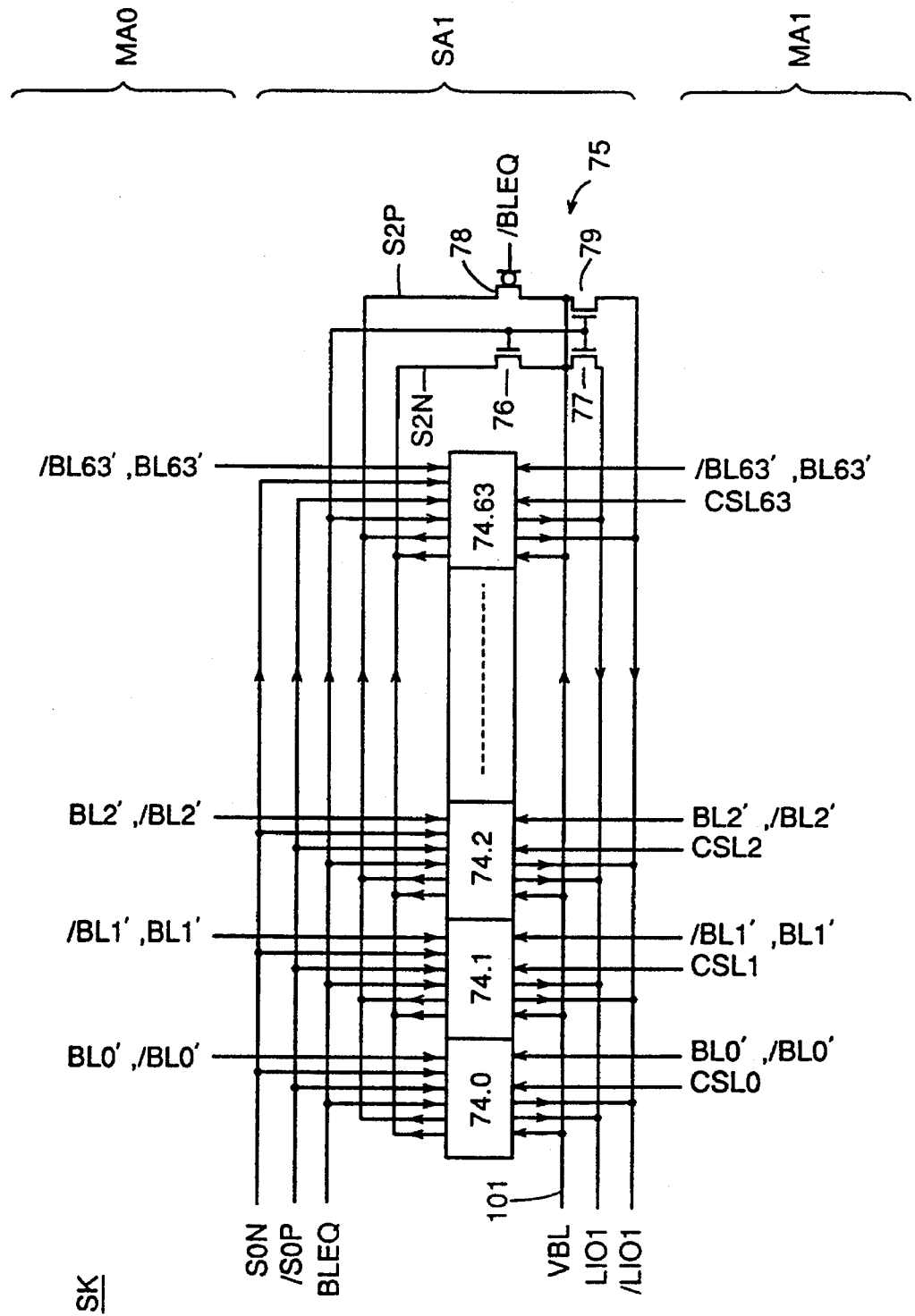
FIG. 18 is a circuit block diagram showing a structure of sense amplifier block SK of sense amplifier region SA1 of memory mat 63 shown in FIG. 14.
Figure 19:
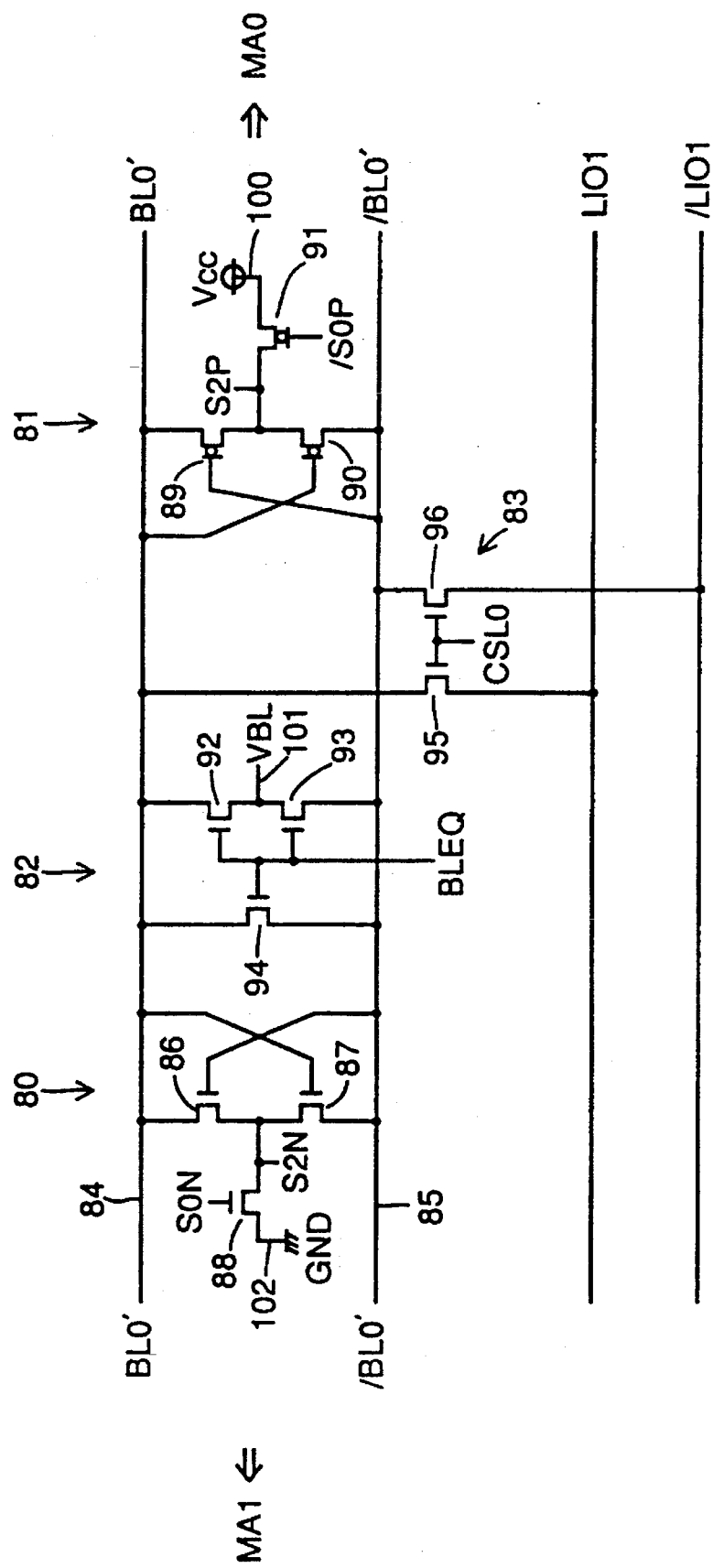
FIGS. 19 and 20 are circuit diagrams showing a structure of a bit line control circuit 74.0 and a bit line control circuit 74.1, respectively, of sense amplifier block SK of FIG. 18.
Figure 20:
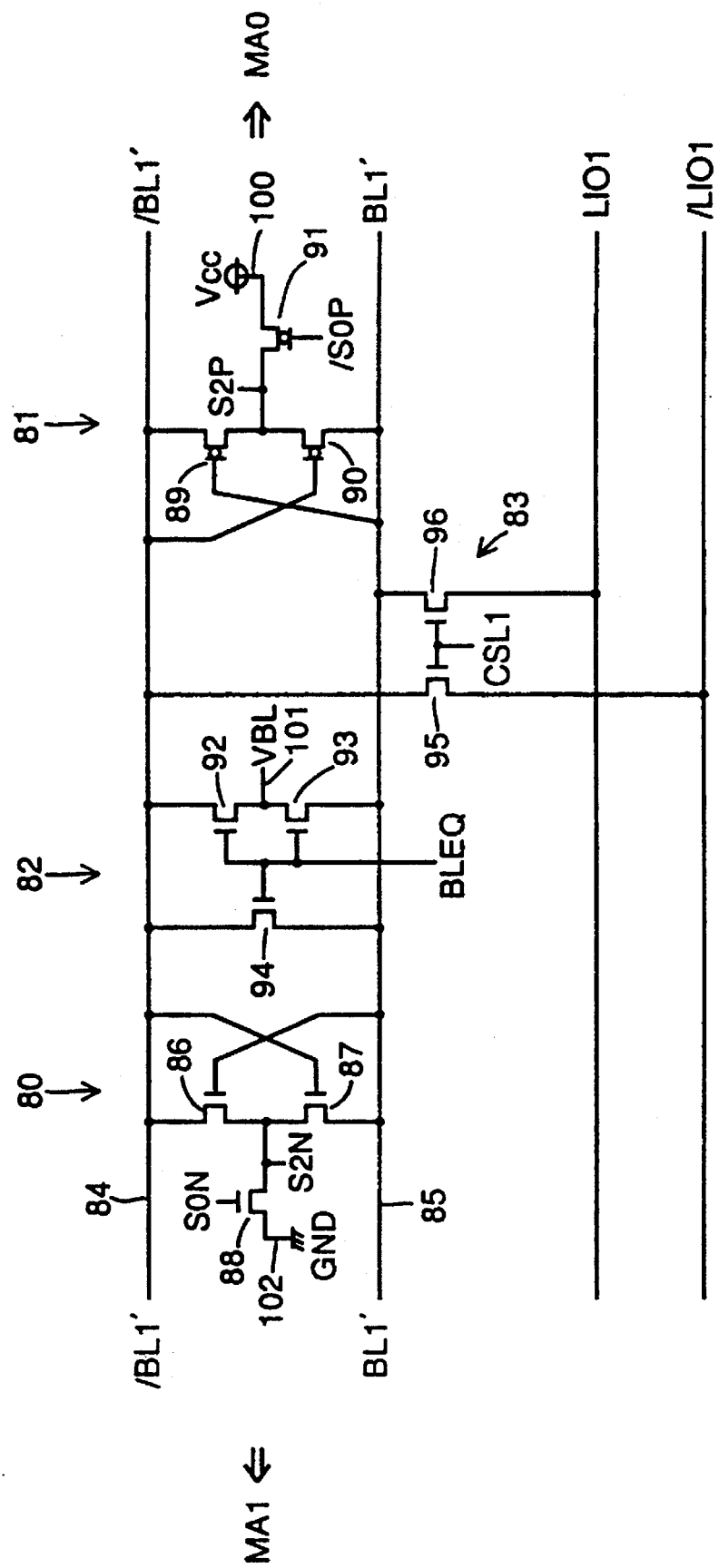
Figure 21:
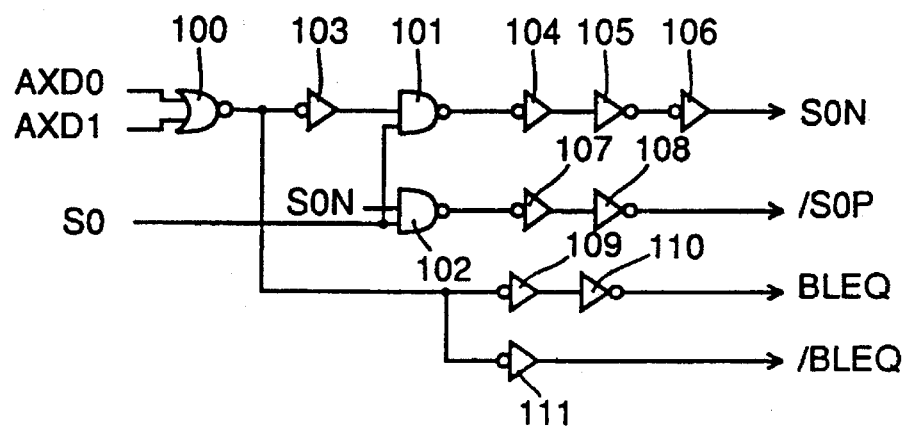
FIG. 21 is a circuit diagram showing a structure of a sense amplifier block control circuit 71 of sense amplifier region SA1 of memory mat 63 of FIG. 14.

FIGS. 2, 3, and 4 correspond to FIGS. 18, 19 and 20 of the conventional. DRAM, respectively.

Referring to FIGS. 2–4, a bit line control circuit 74.0 corresponding to column select line CSL0 is shared by the second pair of bit lines BL0', /BL0' of memory array region MA0 and the first pair of bit lines BL0, /BL0 of memory array region MA1. Bit line control circuit 74.1 corresponding to column select line CSL1 is shared by the fourth pair of bit lines BL1', /BL1' of memory array region MA0 and the third pair of bit lines BL1,/BL1 of memory array region MA1. The same applies for bit line control circuit 74.2–74.63.

Figure 5:
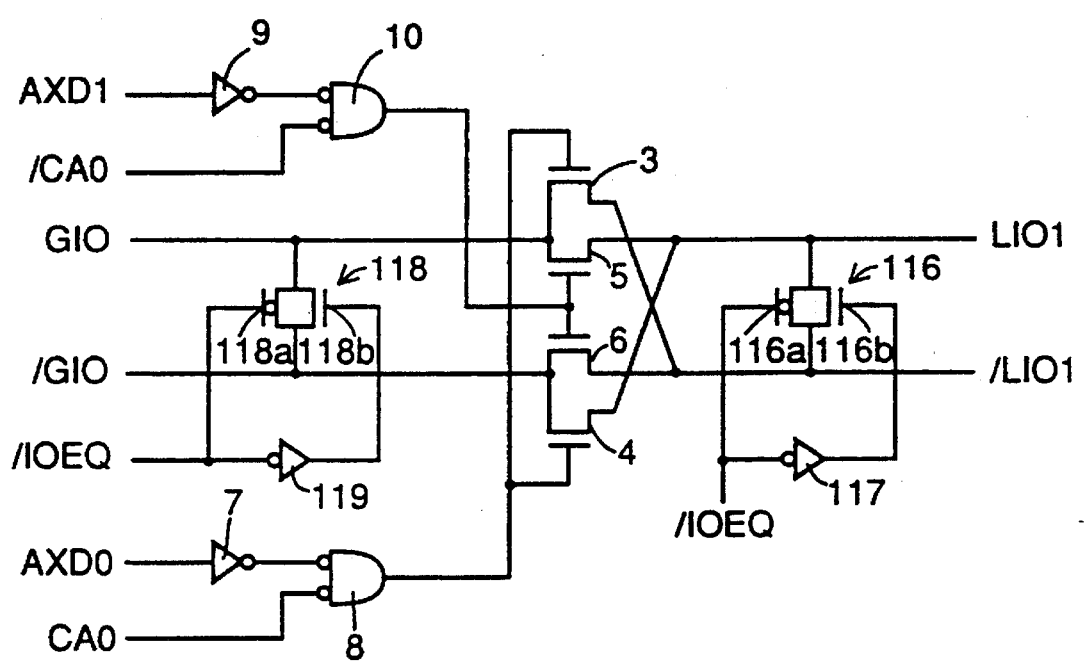
FIG. 5 is a circuit diagram showing a structure of an IO line switching circuit 2 in a sense amplifier region SA1 of memory mat 1 of FIG. 1.
Figure 22:
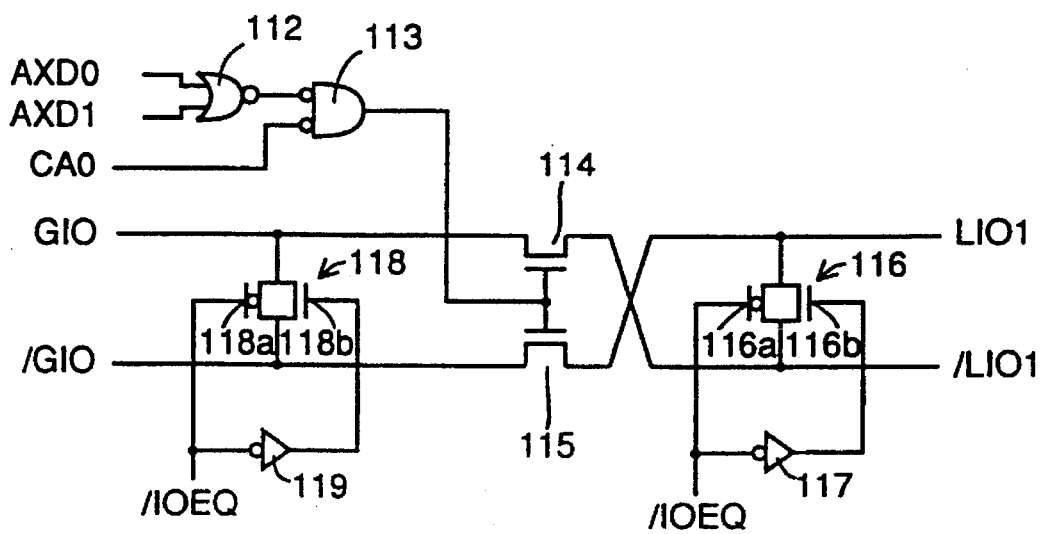
FIGS. 22 and 23 are circuit diagrams showing a structure of an IO line control circuit 72' and an IO line control 72, respectively, of sense amplifier regions SA1 and SA2, respectively, of memory mat 63 of FIG. 14.
Figure 23:
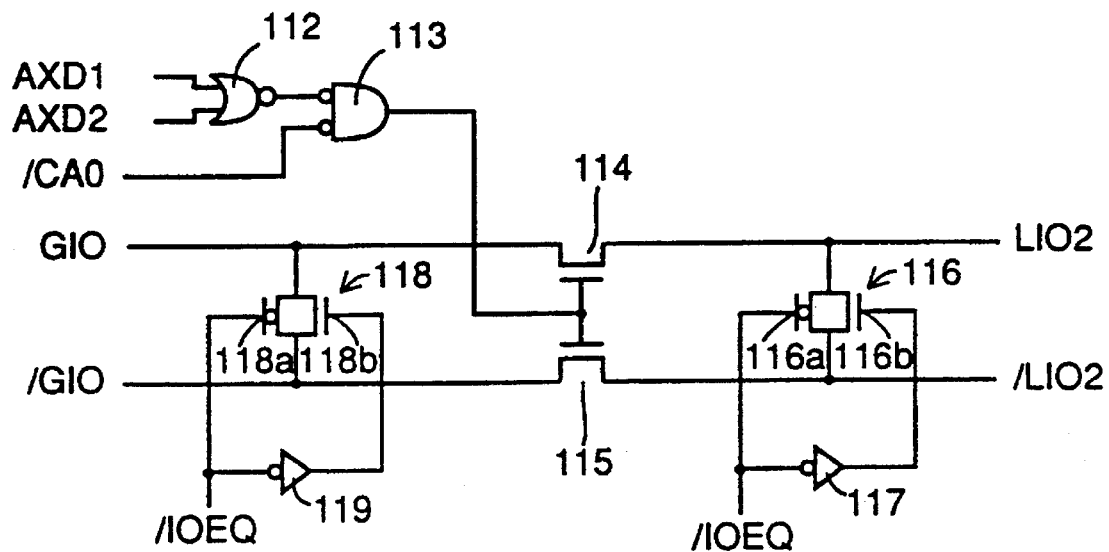
Figure 24:
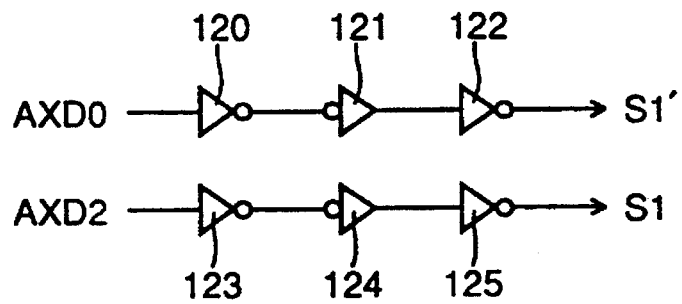
FIG. 24 is a circuit diagram showing a structure of a memory array block control circuit 73 of sense amplifier region SA1 of memory mat 63 of FIG. 14.
Figure 25:
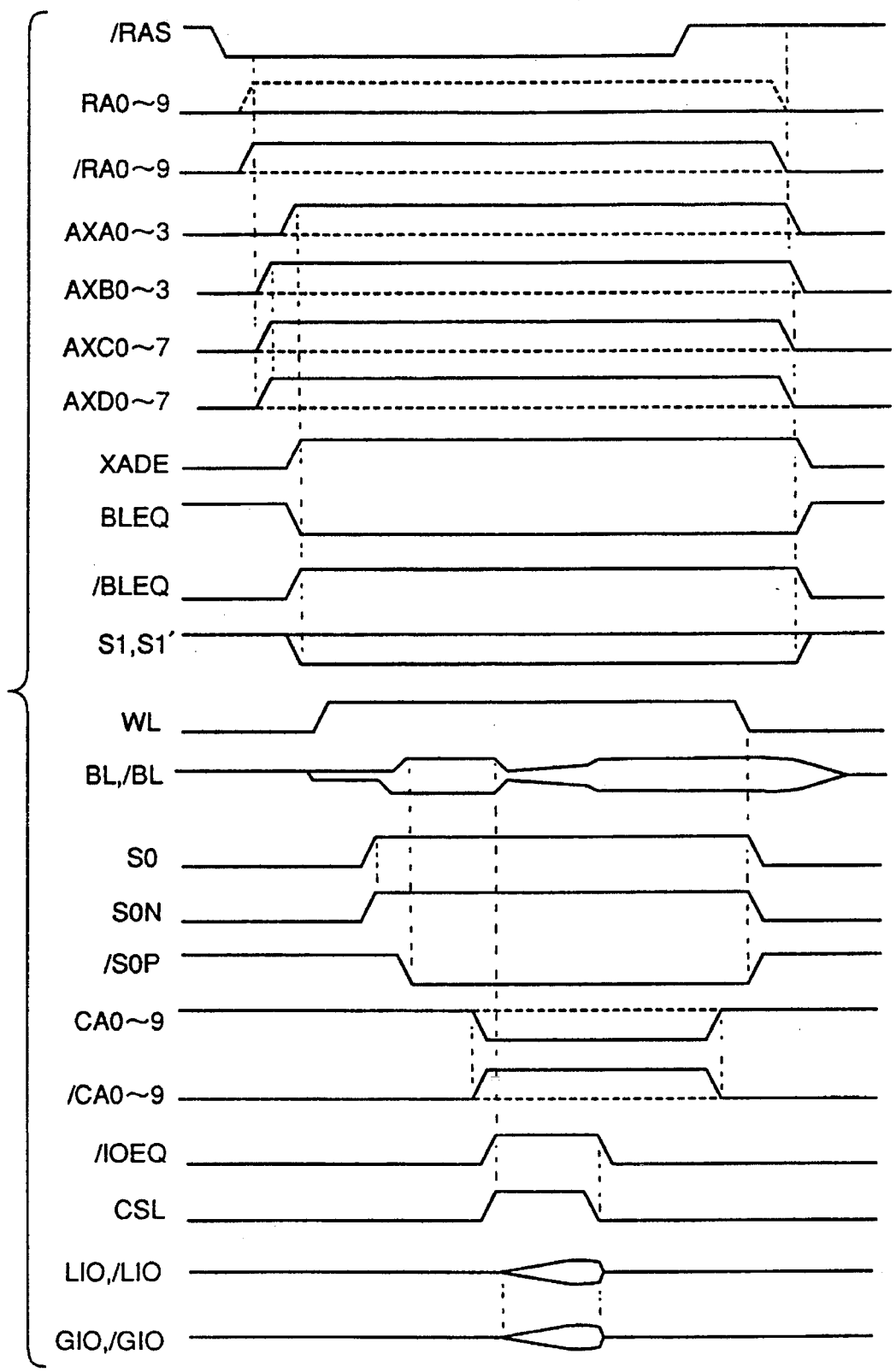
FIG. 25 is a timing chart for describing the operation of the DRAM shown in FIGS. 8–24.
Figure 26:
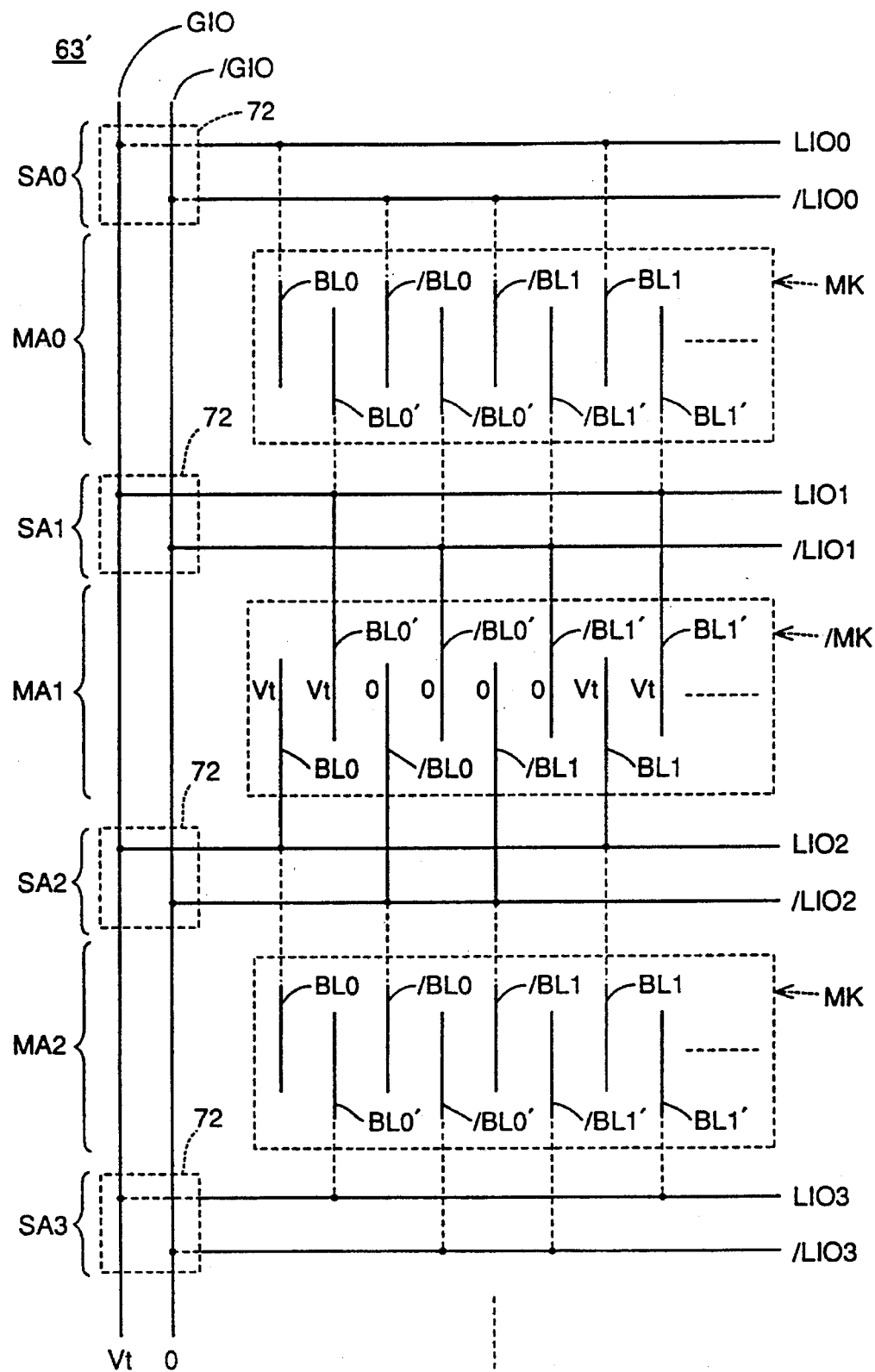
FIGS. 26 and 27 are schematic diagrams for describing the problems during BI testing of the DRAM shown in FIGS. 8–25.

FIG. 5 corresponds to the conventional DRAM of FIG. 22.

Referring to FIG. 5, IO line control circuit 2 includes N channel MOS transistors 3–6, inverters 7, 9, 117, 119, NOR gates 8, 10, and transfers gates 116, 118.

N channel MOS transistor 3 is connected between one end of local signal input/output line /LIO1 and one end of global signal input/output line GION channel MOS transistor 4 is connected between one end of local signal input/output line LIO1 and one end of global signal input/output line/GIO. N channel MOS transistor 5 is connected between one end of global signal input/output line LIO1 and one end of local signal input/output line GIO. N channel MOS transistor 6 is connected between one end of local signal input/output line/LIO1 and one end of global signal input/output line/ GIO. More specifically, the pair of local signal input/output lines LIO1,/LIO1 is connected to the pair of global signal input/output lines GIO,/GIO via N channel MOS transistors 3 and 4 in an opposite phase, and the pair of local signal input/output lines LIO1, /LIO1 is connected to the pair of global signal input/output lines GIO, /GIO via N channel MOS transistors 5, 6 in a positive phase.

Predecode signal AXD0 is applied to one input node of NOR gate 8 via inverter 7, and column address signal CA0 is applied to the other input node of NOR gate 8. The output of NOR gate it is applied to the gates of N channel MOS transistors 3 and 4.

Predecode signal AXD1 is applied to one input node of NOR gate 10 via inverter 9. Column address signal /CA0 is applied to the other input node of NOR gate 10. The output of NOR gate 10 is applied to the gates of N channel MOS transistors 5 and 6. Transfer gates 116 and 118, and inverters 117 and 119 are connected in a manner similar to that of IO line control circuit 72' of FIG. 22.

When signal AXD0 selecting memory array block MK of memory array region L attains an H level of activation and signal CA0 selecting an odd numbered bit line pair attains an L level of inactivation, NOR gate 8 provides a signal of an H level to render N channel MOS transistors 3 and 4 conductive. More specifically, even numbered pair of bit lines BL', /BL' of memory array block MK of memory array region MA0 is connected to the pair of global signal input/output lines GIO, /GIO via the pair of local signal input/output lines LIO1, /LIO1 in an opposite phase.

When signal AXD1 selecting memory array block MK of memory array region MA1 attains an H level of activation and signal /CA0 selecting an odd numbered bit line pair attains an L level of activation, NOR gate 10 provides a signal an H level to render N channel MOS transistors 5 and 6 conductive. More specifically, the odd numbered pair of bit lines BL, /BL of memory array block MK of memory array region MA1 is connected to the pair of global signal input/output lines GIO, /GIO via the pair of local signal input/output lines LIO1, /LIO1 in a positive phase.

Figure 6:
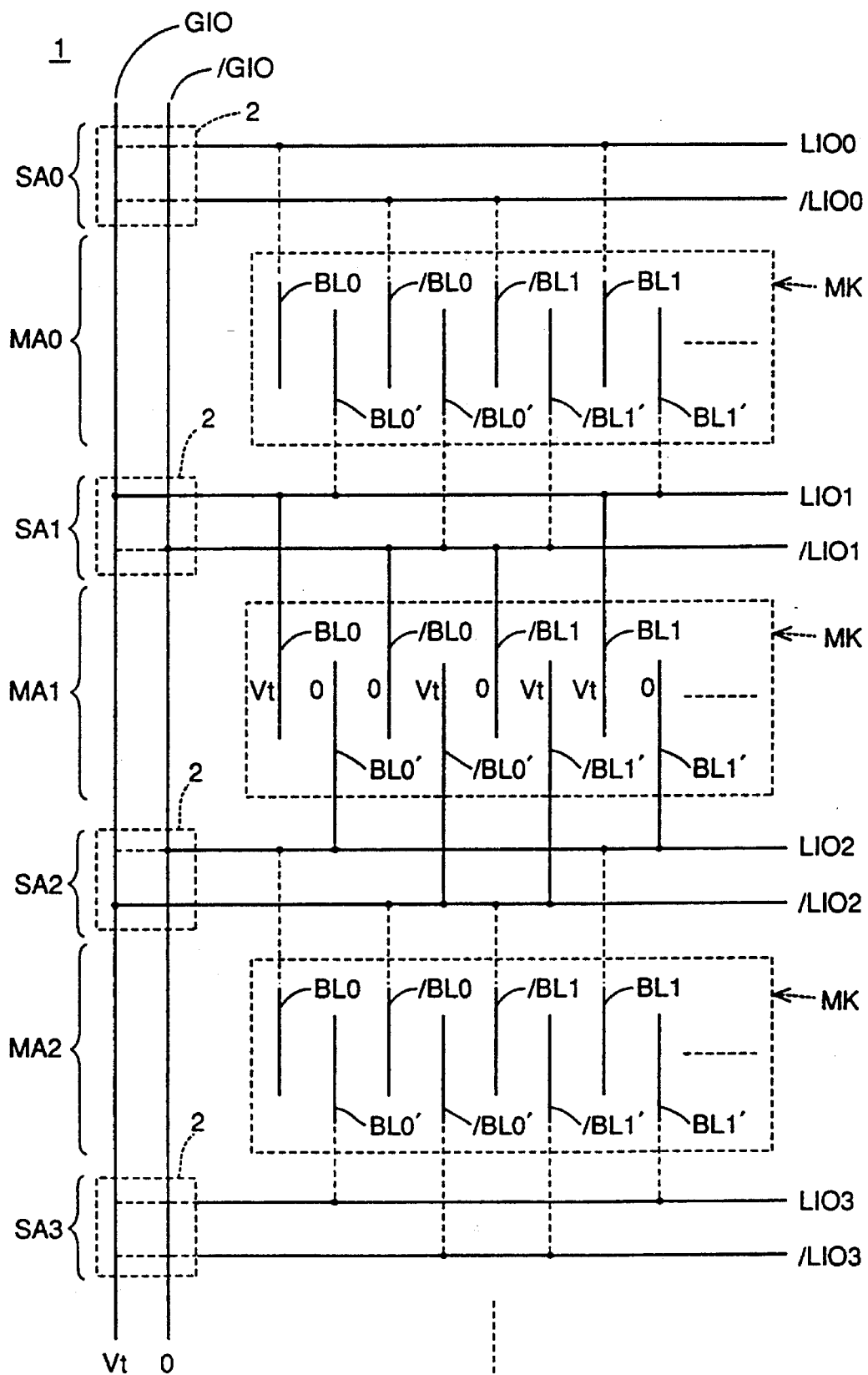
FIGS. 6 and 7 are schematic diagrams for describing the state of BI testing of memory mat 1 of FIG. 1.
Figure 7:
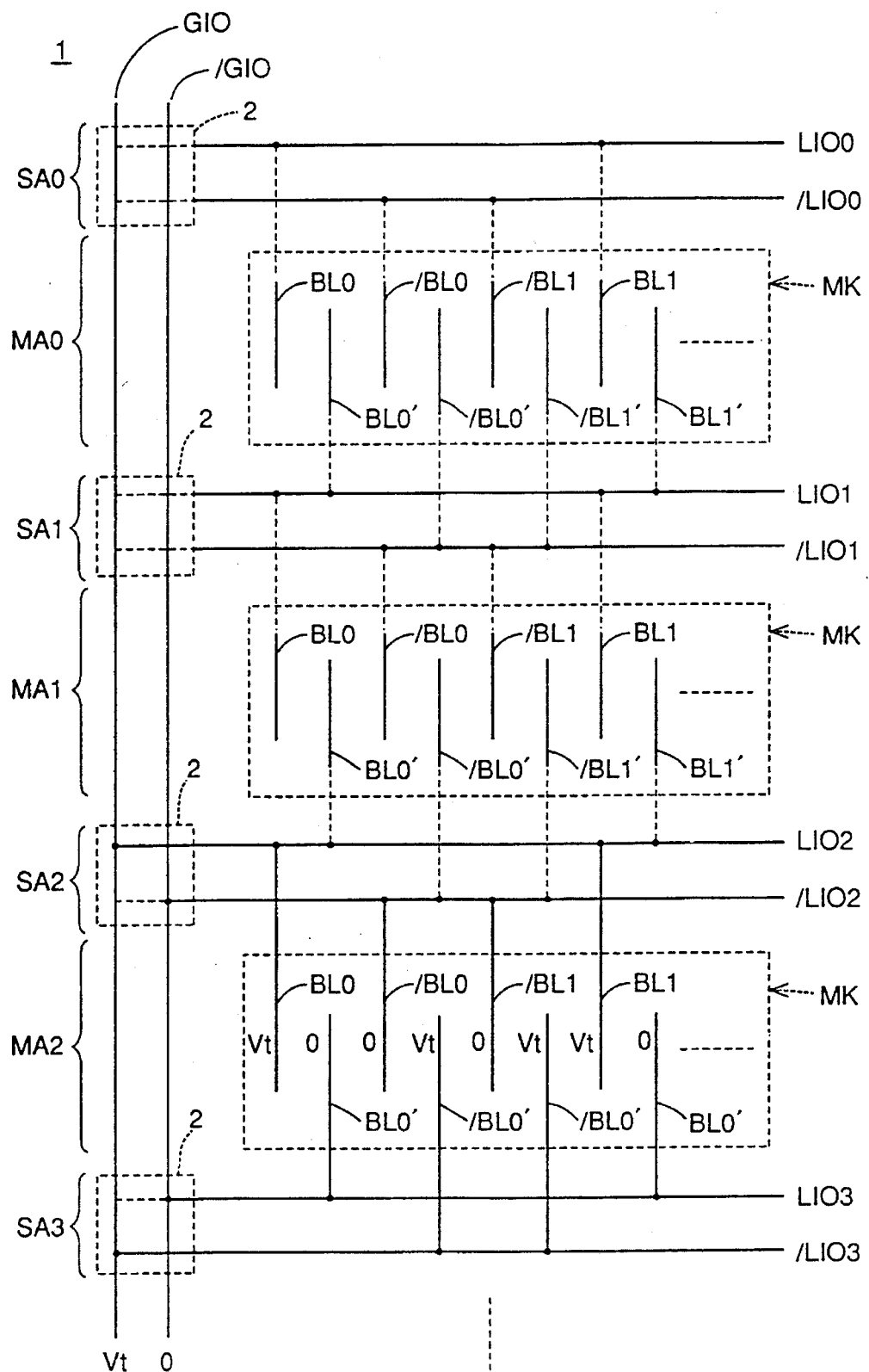
Figure 8:
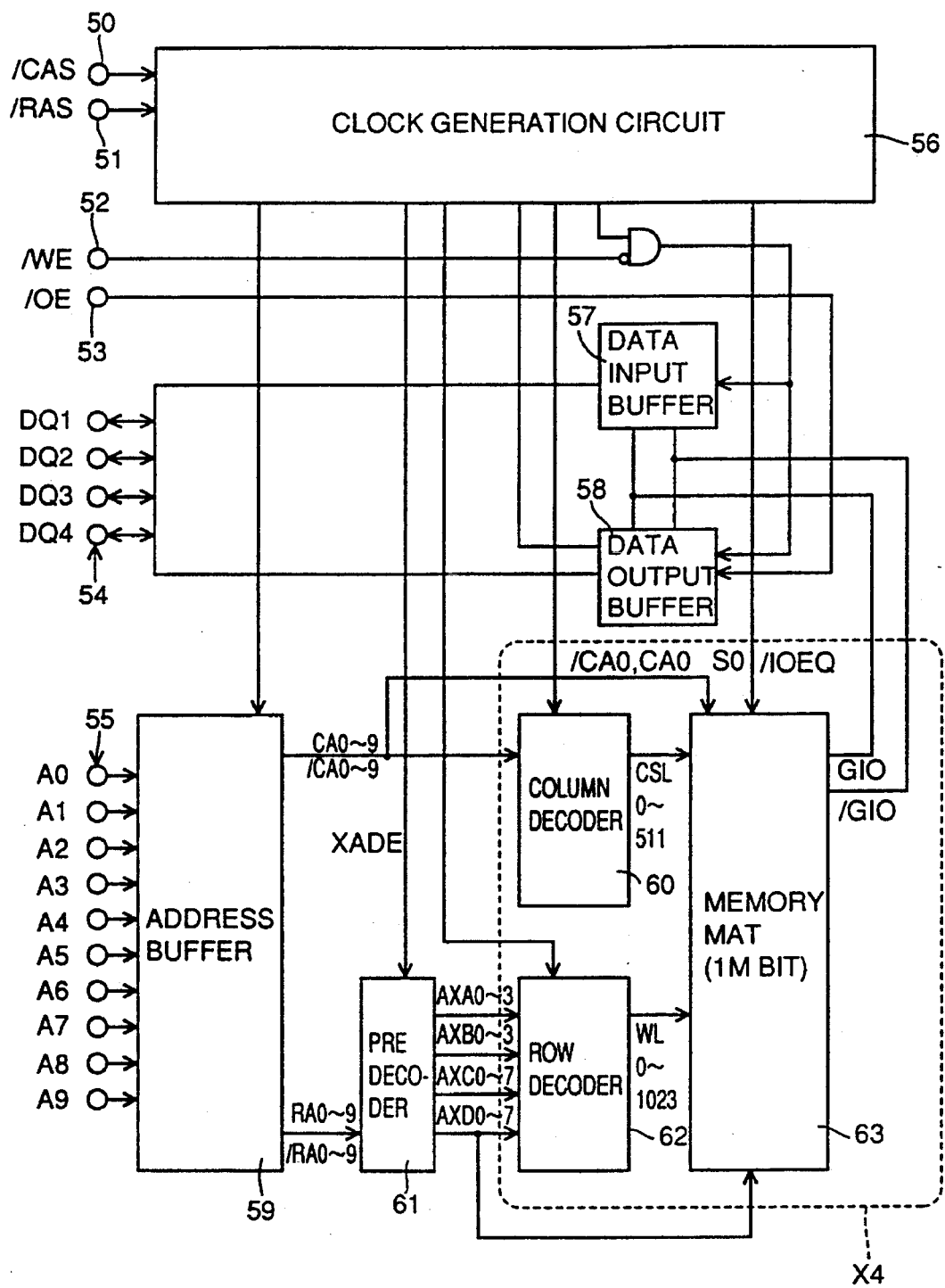
FIG. 8 is a circuit block diagram showing a conventional DRAM.
Figure 9:
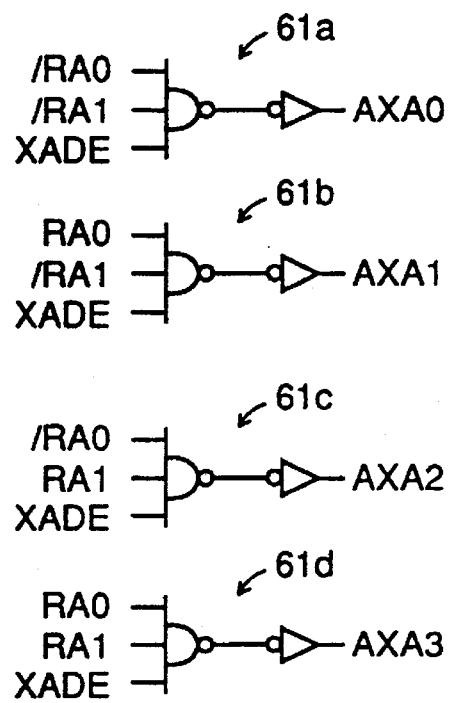
FIGS. 9–12 are circuit diagrams showing a structure of predecoder 61 of FIG. 8.
Figure 10:
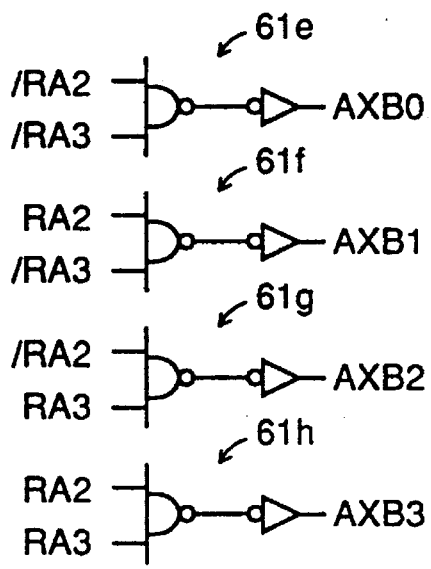
Figure 11:
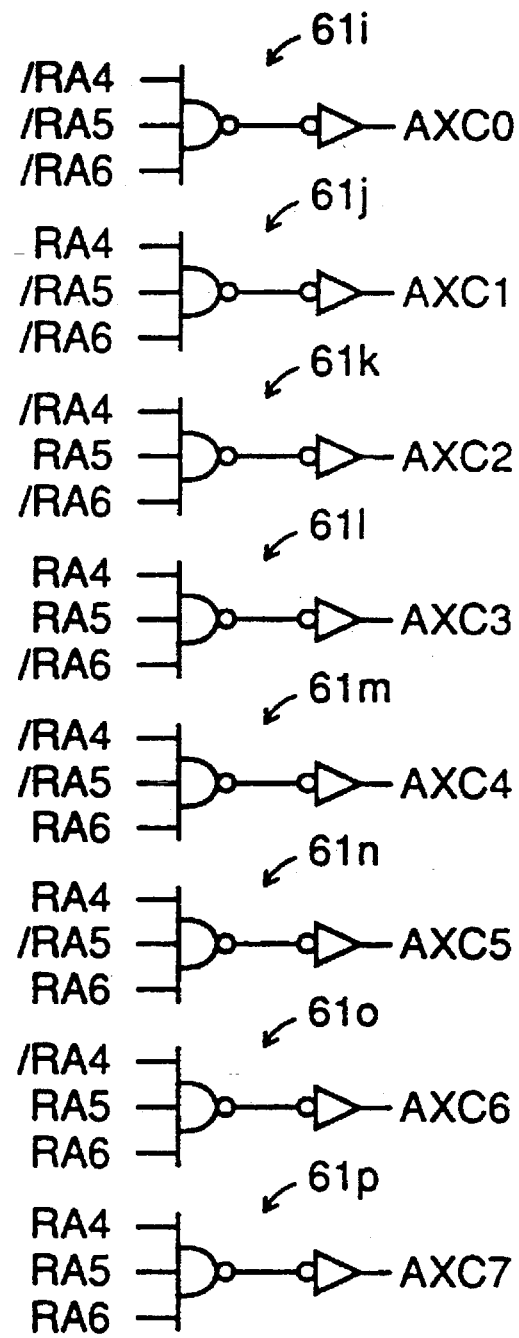
Figure 12:
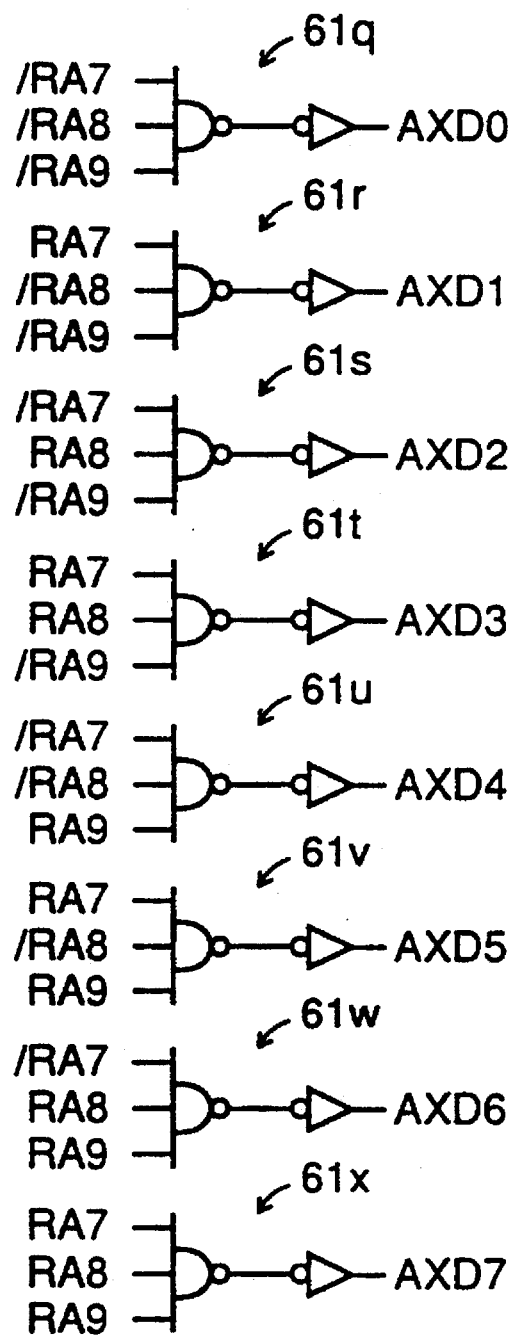
Figure 13:
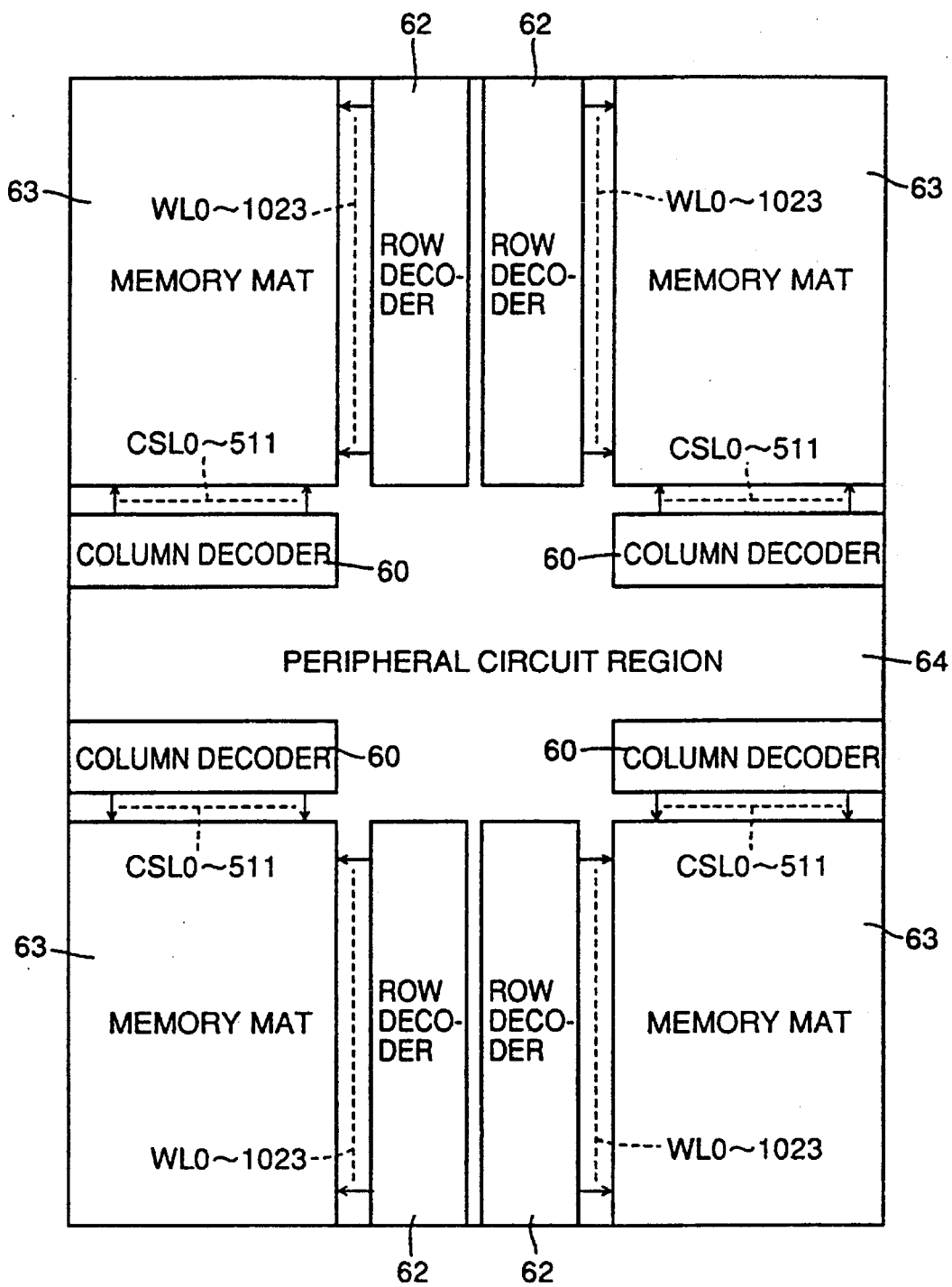
FIG. 13 is a plan view showing a chip layout of the DRAM of FIG. 8.
Figure 27:
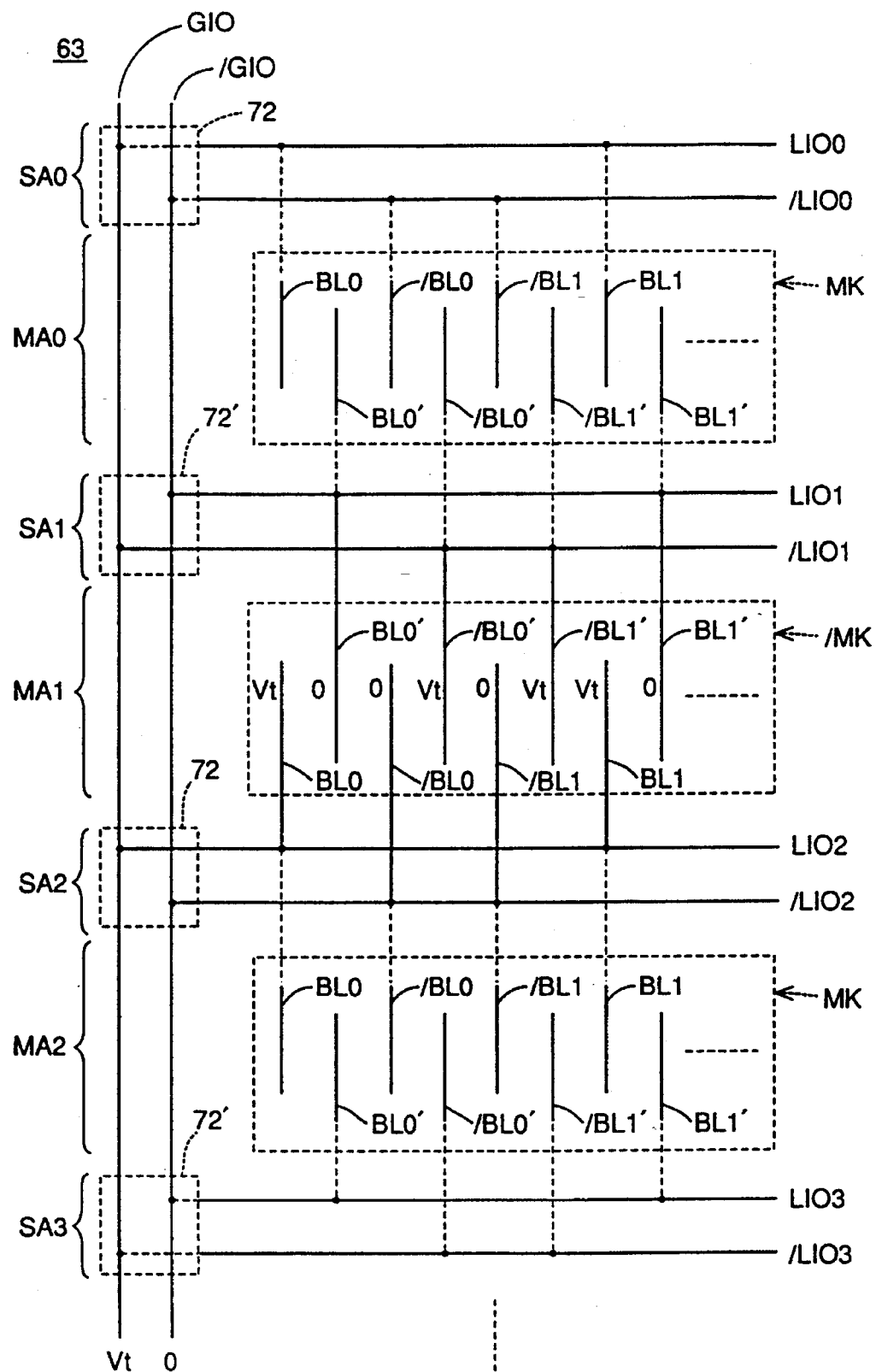

FIGS. 6 and 7 schematically showing memory mat 1 in a BI test, corresponding to FIG. 27.

FIG. 6 shows the state where the pair of local signal input/output lines L01, /LIO1 is connected to the pair of global signal input/output lines GIO, /GIO in a positive phase by IO line control circuit 2 of sense amplifier region SA1, and odd numbered pairs of bit lines BL0, /BL0; /BL1, BL1; . . . of memory array block MK of memory array region MA1 are sequentially connected to the pair of local signal input/output lines LIO1, /LIO1 to result in the state of data "1" being written.

Furthermore, the pair of local signal input/output lines LI02, /LI02 is connected to the pair of global signal input/ output lines GIO, /GIO in an opposite phase by IO line control circuit 2 of sense amplifier region SA2, and even numbered pairs of bit lines BL0',/BL0'; /BL1', BL1'; . . . of memory array block MK of memory array region MA1 are sequentially connected to the pair of local signal input/ output lines LI02, /LI02 to result in the state of data "1" being written.

FIG. 7 shows the state where the pair of local signal input/output lines LI02, /LI02 is connected to the pair of global signal input/output lines GIO, /GIO in a positive phase by IO line control circuit 2 of sense amplifier region SA2, and odd numbered pairs of bit lines BL0, /BL0; /BL1, BL1; . . . of memory array block MK of memory array region MA2 are sequentially connected to the pair of local signal input/output kines LI02, /LIO2 to have data "1" written.

Furthermore, the pair of local signal input/output lines LI03, /LI03 is connected to the pair of global signal input/ output lines GIO, /GIO in an opposite phase by IO signal control circuit 2 of sense amplifier region SA3, and even numbered pairs of bit lines BL0', /BL0'; /BL1', BL1'; . . . of memory array block MK of memory array region MA2 are sequentially connected to the pair of local signal input/ output lines LI03, /LI03 to result in state of data "1" being written.

Since memory array block MK of the same structure is arranged in all memory array regions MA0–MA7 in the present embodiment, a memory cell corresponding to a defective address detected in the BI test can easily be identified in comparison with the case where memory array blocks of memory array regions MA0–MA7 are mirror-inverted alternately.

IO line control circuit 2 of each of sense amplifier regions SA1–SA7 connects a corresponding pair of local signal input/output lines LIO1, /LIO1; . . . ; LI07, /LI07 to the pair of global signal input/output lines GIO, /GIO in an opposite phase or a positive phase according to whether the upper row of memory array regions MA0–MA6 or the lower row of memory array regions MA1–MA7 of each of sense amplifier regions SA1–SA7 are selected. Therefore, at least one of the two bit lines adjacent to a certain bit line at either side can be set to a potential different from that of the certain bit line even when using a test device of a low cost in which only the same data can be written into all the addresses. Thus, a DRAM of high reliability in which testing of high defective detection capability with a test device of a low cost can be provided at a low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which electrical rewriting of data is possible, comprising:

a plurality of memory array blocks arranged in an extending direction of a bit line pair, each memory array block including a plurality of memory cells arranged in a matrix, a word line provided corresponding to each row, and said bit line pair provided corresponding to each column, a pair of local signal input/output lines provided corresponding to each two adjoining memory array blocks, and in common to an even numbered bit line pair of a memory array block positioned in one direction of corresponding two memory blocks and an odd numbered bit line pair of a memory array block positioned in another direction, a pair of global signal input/output lines provided in common to said plurality of memory array blocks, a select circuit responsive to an externally applied address signal for selecting any of said plurality of memory array blocks, and any memory cell belonging to the selected memory array block, connection means for connecting a bit line pair corresponding to a memory cell selected by said select circuit to one end of a corresponding pair of local signal input/output lines, switching means provided corresponding to each pair of local signal input/output for connecting the other end of a corresponding pair of local signal input/output lines to one end of said pair of global signal input/output lines in an opposite phase in response to a bit line pair corresponding to a memory cell selected by said select circuit being an even numbered bit line pair of a memory array block positioned in one direction of corresponding two memory array blocks, and for connecting the other end of a corresponding Fair of local signal input/output lines to one end of said pair of global signal input/output lines in response to a bit line pair corresponding to the memory cell selected by said select circuit being an odd numbered bit line pair of a memory array block positioned in another direction of the corresponding two memory array blocks, and data input/output means for providing a data signal input/output between the other end of said pair of global signal input/output lines and the outside world.

2. The semiconductor memory device according to claim 1, wherein each of said plurality memory array blocks comprises 8×N (N is a positive integer) bit lines, and the (8n+1)th (n is an integer from 0 to N−1) and (8n+3)th bit lines, the (8n+2)th and (8n+4)th bit lines, the (8n+7)th and (8n+5)th bit lines and the (8n+8)th and (8n+6)th bit lines respectively form said bit line pair.

3. The semiconductor memory device according to claim 2, wherein said switching means comprises a first logic circuit for providing a first signal in response to receiving both a block select signal to select said memory array block positioned in one direction and a column select signal to select an even numbered bit line pair included in said address signal, first connection means responsive to an output of said first signal from said first logic circuit for connecting the other end of said pair of local signal input/output lines to one end of said pair of global signal in, put/output lines in an opposite phase, a second logic circuit for providing a second signal in response to receiving both a block select signal to select memory array block positioned in another direction and a column select signal to select an odd numbered bit line pair included in said address signal, and second connection means responsive to an output of said second signal from said second logic circuit for connecting the other end of said pair of global signal input/output lines to one end of said pair of local signal input/output lines in a positive phase.

* * * * *